US012114479B2

(12) United States Patent
Gomes et al.

(10) Patent No.: US 12,114,479 B2
(45) Date of Patent: Oct. 8, 2024

(54) THREE-DIMENSIONAL MEMORY ARRAYS WITH LAYER SELECTOR TRANSISTORS

(71) Applicant: Intel Corporation, Santa Clara, CA (US)

(72) Inventors: Wilfred Gomes, Portland, OR (US); Mauro J. Kobrinsky, Portland, OR (US); Abhishek A. Sharma, Hillsboro, OR (US); Rajesh Kumar, Portland, OR (US); Kinyip Phoa, Beaverton, OR (US); Elliot Tan, Portland, OR (US); Tahir Ghani, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 17/368,329

(22) Filed: Jul. 6, 2021

(65) Prior Publication Data
US 2021/0335791 A1    Oct. 28, 2021

Related U.S. Application Data

(63) Continuation of application No. 16/689,789, filed on Nov. 20, 2019, now Pat. No. 11,139,300.

(51) Int. Cl.
H10B 12/00         (2023.01)
G11C 5/06          (2006.01)
(Continued)

(52) U.S. Cl.
CPC ............. *H10B 12/31* (2023.02); *G11C 5/063* (2013.01); *H01L 23/5226* (2013.01);
(Continued)

(58) Field of Classification Search
CPC ............. H01L 23/5226; H01L 23/5283; H01L 27/0688; H01L 29/78696; H10B 12/30; H10B 12/31; G11C 5/063
See application file for complete search history.

(56) References Cited

U.S. PATENT DOCUMENTS

2018/0277171 A1    9/2018  Matsuoka et al.
2020/0005846 A1    1/2020  Liu et al.
(Continued)

FOREIGN PATENT DOCUMENTS

WO    WO-2016198965 A1 * 12/2016 ............. G11C 11/15

*Primary Examiner* — Matthew E Warren
(74) *Attorney, Agent, or Firm* — Akona IP PC

(57) ABSTRACT

A three-dimensional memory array may include a first memory array and a second memory array, stacked above the first. Some memory cells of the first array may be coupled to a first layer selector transistor, while some memory cells of the second array may be coupled to a second layer selector transistor. The first and second layer selector transistor may be coupled to one another and to a peripheral circuit that controls operation of the first and/or second memory arrays. A different layer selector transistor may be used for each row of memory cells of a given memory array and/or for each column of memory cells of a given memory array. Such designs may allow increasing density of memory cells in a memory array having a given footprint area, or, conversely, reducing the footprint area of the memory array with a given memory cell density.

20 Claims, 14 Drawing Sheets

(51) Int. Cl.
*H01L 23/522* (2006.01)
*H01L 23/528* (2006.01)
*H01L 27/06* (2006.01)
*H01L 29/786* (2006.01)

(52) U.S. Cl.
CPC ...... *H01L 23/5283* (2013.01); *H01L 27/0688* (2013.01); *H01L 29/78696* (2013.01); *H10B 12/30* (2023.02)

(56) References Cited

U.S. PATENT DOCUMENTS

2020/0035683 A1  1/2020 Sharma et al.
2020/0286906 A1  9/2020 Karda et al.
2020/0295006 A1* 9/2020 Akasawa ............ G11C 11/4085
2020/0411078 A1* 12/2020 Sharma ................ H10B 12/315
2021/0082495 A1* 3/2021 Huang .................. H10B 10/12

\* cited by examiner

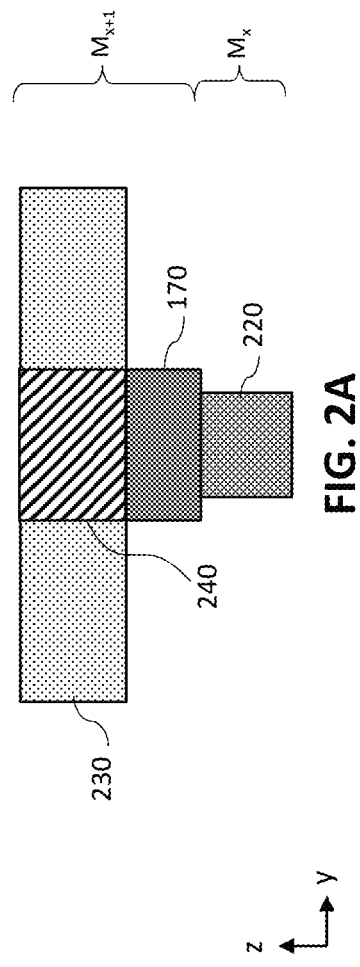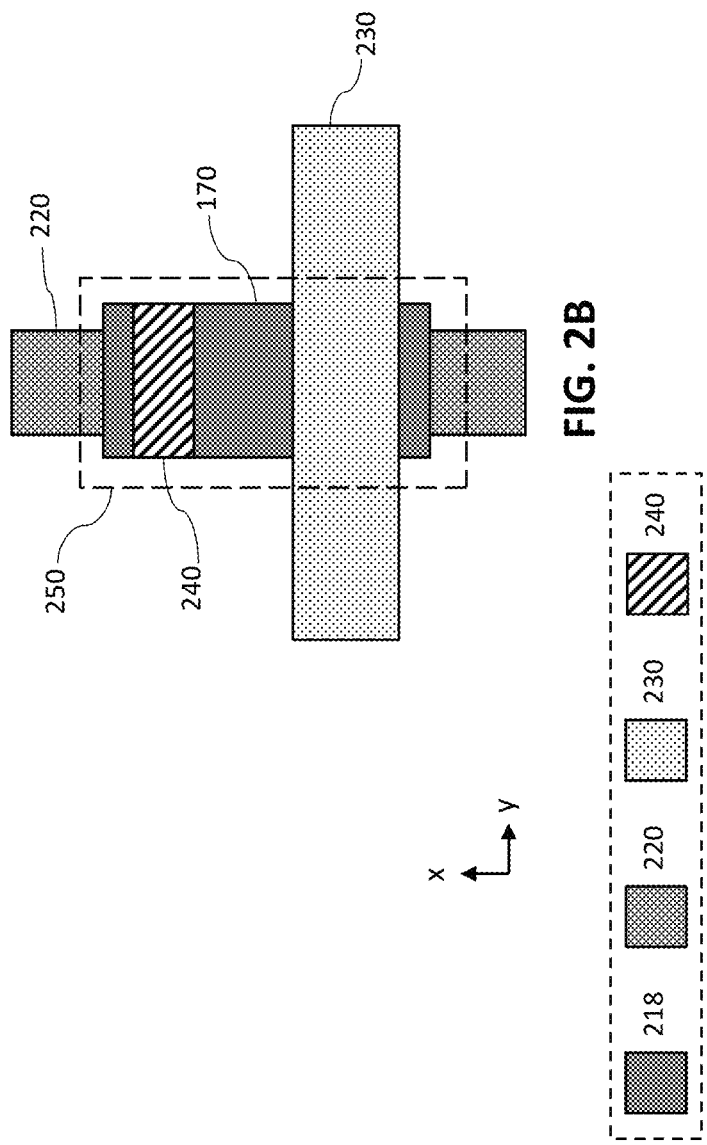

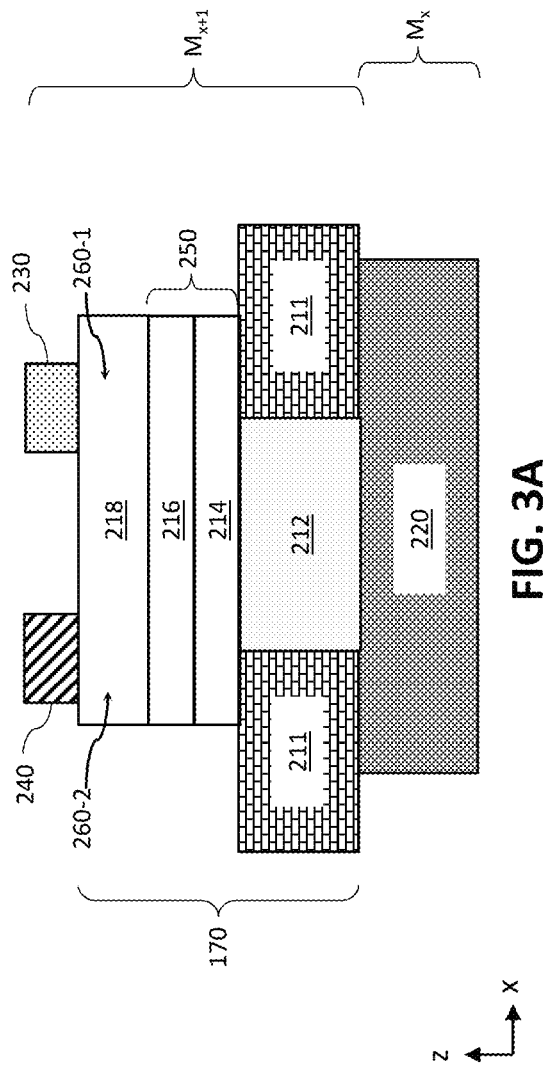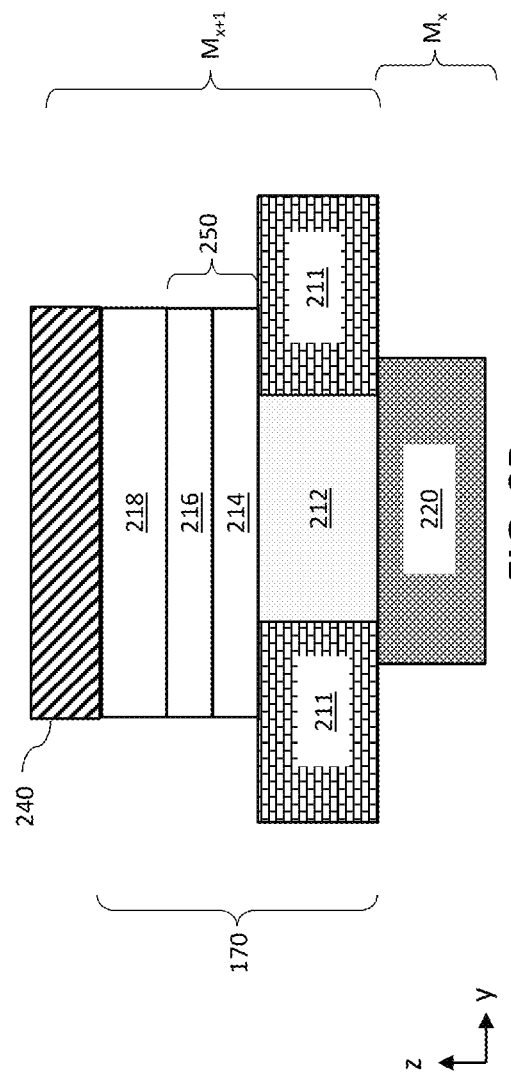

THREE-DIMENSIONAL MEMORY ARRAYS WITH LAYER SELECTOR TRANSISTORS

CROSS REFERENCE TO RELATED APPLICATION

This application is a continuation of U.S. application Ser. No. 16/689,789, filed Nov. 20, 2019, entitled "THREE-DIMENSIONAL MEMORY ARRAYS WITH LAYER SELECTOR TRANSISTORS," incorporated herein by reference in its entirety.

BACKGROUND

Embedded memory is important to the performance of modern system-on-a-chip (SoC) technology. Static random-access memory (SRAM) is one example of embedded memory, particularly suitable for modern SoC due to its compatibility with fabrication processes used to manufacture computing logic, e.g., front end of line (FEOL) processes. However, for some applications demanding large on-die cache, such as tens of megabytes (MBs) for handling memory bandwidth, the area and standby power of a SRAM-based cache may pose significant challenges to SoC design. Alternative higher density embedded memory technology, such as dynamic random-access memory (DRAM) and in particular, embedded DRAM (eDRAM), has been introduced to address the limitation in density and standby power of a large SRAM-based cache.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2B are cross-sectional and top-down views, respectively, of an example access thin film transistor (TFT) in a TFT based embedded DRAM (eDRAM) memory cell, according to some embodiments of the present disclosure.

FIGS. 3A-3B are cross-sectional views of an example structure of the access transistor in the memory cell of FIGS. 2A-2B, according to some embodiments of the present disclosure.

DETAILED DESCRIPTION

Overview

Figure 1:
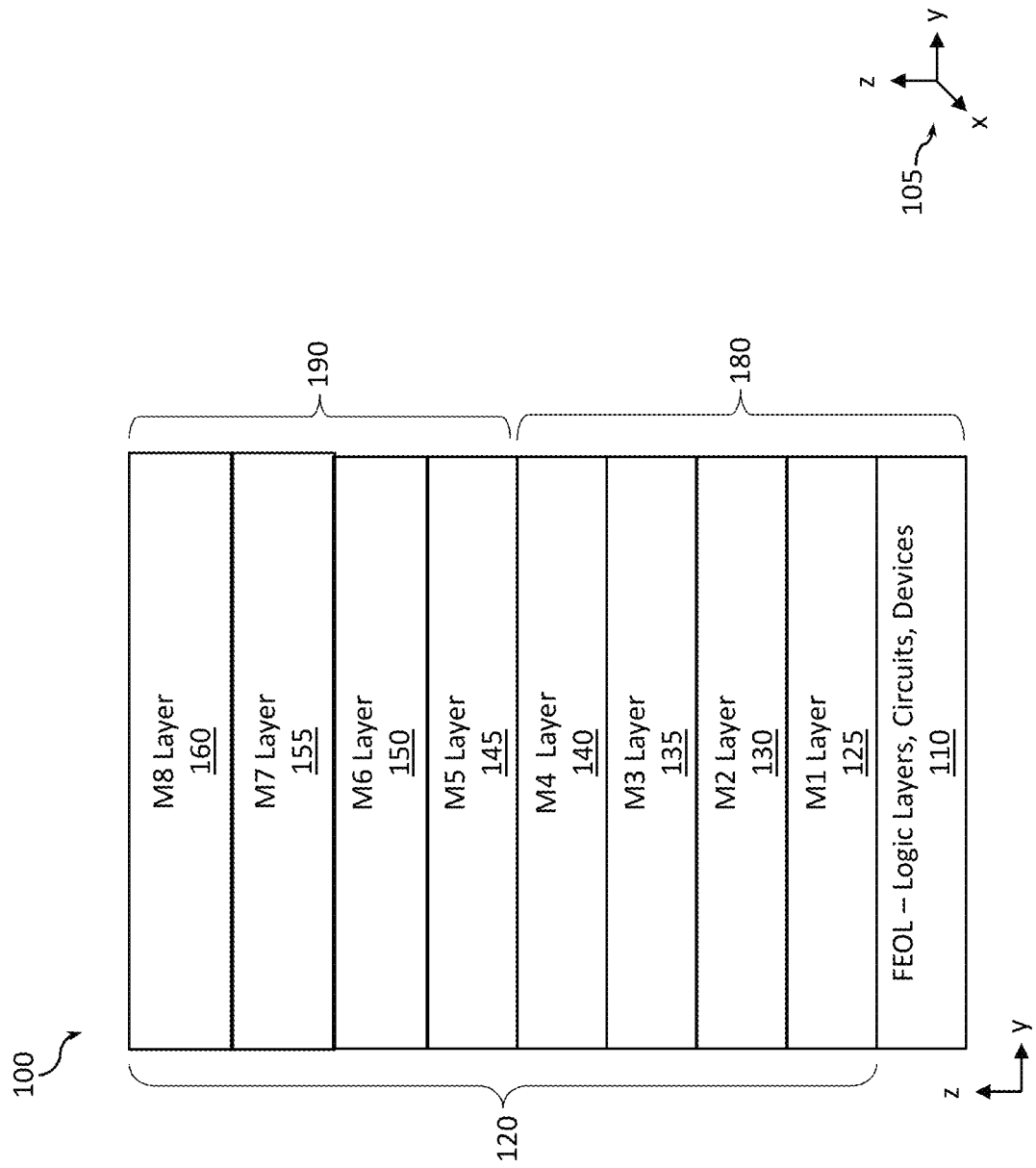
FIG. 1 provides a schematic illustration of a cross-sectional view of an example integrated circuit (IC) device, according to some embodiments of the present disclosure

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. Various embodiments of the present disclosure relate to embedded memory arrays (e.g., DRAM memory arrays), as well as corresponding methods and devices.

A standard eDRAM memory cell includes a capacitor for storing a bit value, or a memory state (i.e., logical "1" or "0") of the cell, and an access transistor (also sometimes referred to as a "selector transistor") controlling access to the cell. The capacitor is coupled to one source/drain (S/D) electrode of the access transistor, while the other S/D electrode of the access transistor is coupled to a bitline (BL), and a gate electrode of the transistor is coupled to a wordline (WL). Since the eDRAM memory cell can be fabricated with as little as a single access transistor, eDRAM can provide higher density and lower standby power versus SRAM in the same process technology.

Various eDRAM memory cells have, conventionally, been implemented with access transistors being FEOL, logic-process based, transistors implemented in an uppermost layer of a semiconductor substrate. Using standard logic transistors as access transistors of eDRAM creates several challenges.

One challenge relates to the location of the capacitors such eDRAM cells. Namely, it is desirable to provide capacitors in metal layers close to their corresponding access transistors. Since logic transistors are implemented as FEOL transistors provided directly on the semiconductor substrate, the corresponding capacitors of eDRAM cells then have to be embedded in lower metal layers in order to be close enough to the logic access transistors. As the pitches of lower metal layers aggressively scale in advanced technology nodes, embedding the capacitors in the lower metal layers poses significant challenges to the scaling of eDRAM. Another challenge with using standard logic transistors as access transistors of eDRAM resides in that, given a usable surface area of a substrate, there are only so many FEOL transistors that can be formed in that area, placing a significant limitation on the density of memory cells of a memory array.

Recent advancements in TFT technology as well as in building transistors in higher layers above the substrate using layer transfer technology may suggest that extending memory arrays into higher layers, e.g., by stacking various planar memory arrays in different layers on top of one another over the substrate, may be used to overcome the scaling challenges described above. However, stacking of conventional, planar memory arrays to create a three-dimensional structure is not trivial. In particular, the amount of peripheral circuits needed to support functionality of all of the stacked memory arrays may quickly get out of control, compromising the commercial viability of the stacking approach.

Embodiments of the present disclosure may improve on at least some of the challenges and issues described above. In particular, three-dimensional memory arrays with layer selector transistors are described. In one aspect, a plurality of memory cells of a first planar memory array may be coupled to a first layer selector transistor, while a plurality of memory cells of a second planar memory array, stacked above the first planar memory array, may be coupled to a second layer selector transistor. A second planar memory array stacked above the first planar memory array allows realizing a three-dimensional memory array. In various embodiments, three-dimensional memory arrays described herein may have further memory layers stacked over one another. The first and second layer selector transistor may be coupled to one another and to a peripheral circuit that controls operation of the first and/or second memory arrays by what may be referred to as a "deep via," which, in general, refers to an interconnect structure configured to provide electrical connectivity between the layer selector transistors of different layers and their respective peripheral circuits. Multiple such layer selector transistors may be included in a given planar memory array, depending on the design. For example, in some embodiments, a different layer selector transistor may be used for each row of memory cells of a planar memory array (which may, e.g., be coupled to a single common wordline) and/or a different layer selector transistor may be used for each column of memory cells (which may, e.g., be coupled to a single common bitline) of a planar memory array. Different deep vias may then be used to electrically couple the layer selector transistors of different memory layers.

In context of the present disclosure, the term "above" may refer to being further away from a substrate (or, more generally, a support structure) or the FEOL of an IC device (e.g. the IC device 100 shown in FIG. 1), while the term "below" may refer to being closer towards the substrate or the FEOL of the IC device. Furthermore, the term "planar memory array" may refer to a memory array in which memory cells are arranged in rows and columns. The term "planar" in this context does not imply or require that various components of the memory array are planar (e.g., two-dimensional) and, in fact, in many embodiments they are not—e.g., the storage capacitors of various memory cells may be three-dimensional capacitors. The term "planar" is, therefore, merely used to differentiate a given memory array with memory cells arranged in rows and columns from what is referred to herein as a "three-dimensional memory array," which is a memory array that includes a plurality of planar memory arrays stacked above one another.

Stacking of planar memory arrays above one another may allow significantly increasing density of memory cells in a memory array having a given footprint area (the footprint area being defined as an area in a plane of the substrate, or a plane parallel to the plane of the substrate, e.g., the x-y plane of an example coordinate system shown in the present drawings), or, conversely, allows significantly reducing the footprint area of the memory array with a given memory cell density. Furthermore, by embedding at least some, but preferably all, of the access transistors and the corresponding capacitors in the upper metal layers (e.g., in the back end of line (BEOL) layers) according to at least some embodiments of the present disclosure, the peripheral circuits that control the memory operation can be hidden below the memory area to substantially reduce the memory macro array (e.g., the footprint area in the x-y plane of an example coordinate system shown in the figures of the present disclosure). Peripheral circuits of conventional eDRAM designs may account for more than 35% of the total memory macro area, so moving the peripheral circuits below the memory array can substantially reduce the memory footprint area. Still further, using layer selector transistors in the manner described herein advantageously allows sharing peripheral circuit(s) among two or more planar memory arrays, effectively implementing multiplexing of peripheral circuits among different layers of memory arrays. As a result, the amount of the peripheral circuits used to support a certain density of memory cells arranged in three-dimensional memory arrays may be significantly reduced, reducing power consumption and chip area. Other technical effects will be evident from various embodiments described here.

Some embodiments of the present disclosure may use TFTs as at least some of access transistors of the memory cells and/or as layer selector transistors. A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer. Using TFTs as at least some of access transistors of the memory cells and/or as layer selector transistors described herein provides several advantages and enables unique architectures that were not possible with conventional, FEOL logic transistors. For example, one advantage is that a TFT may have substantially lower leakage than a logic transistor, allowing to relax the demands on the large capacitance placed on a capacitor of a memory cell. In other words, using a lower leakage TFT in a memory cell allows the memory cell to use a capacitor with lower capacitance and smaller aspect ratio while still meeting the same data retention requirements of other approaches, alleviating the scaling challenges of capacitors. In addition, access transistors implemented as TFTs may be moved to the BEOL layers of an advanced complementary metal oxide semiconductor (CMOS) process, which means that their corresponding capacitors can be implemented in the upper metal layers with correspondingly thicker interlayer dielectric (ILD) and larger metal pitch to achieve higher capacitance. This eases the integration challenge introduced by embedding the capacitors.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

While some descriptions provided herein may refer to bottom-gated transistors, embodiments of the present disclosure are not limited to only this design and may include transistors of various other architectures, or a mixture of different architectures. For example, in various embodiments, various transistors described herein may include top-gated transistors, or any combination of bottom-gated transistors and top-gated transistors. In addition, in various embodiments, various transistors described herein may include planar transistors, or transistors of nonplanar architecture such as FinFETs, nanowire transistors, nanoribbon transistors, etc., all of which being within the scope of the present disclosure. Furthermore, using the term "eDRAM" to refer to a particular IC device that includes a three-dimensional memory array with layer selector transistors as described herein does not preclude the IC device from including other types of devices besides memory or other types of memory cells besides eDRAM (or other types of memory cells besides DRAM based memory cells). For example, in some embodiments, three-dimensional memory arrays as described herein may also include SRAM memory cells in any of the layers.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 2A-2B, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various three-dimensional memory arrays with layer selector transistors as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Architecture Considerations

FIG. 1 provides a schematic illustration of a cross-sectional view of an example IC device (e.g., a chip) 100, according to some embodiments of the present disclosure. FIG. 1 illustrates an example coordinate system 105 with axes x-y-z so that the various planes illustrated in FIG. 1 and in some subsequent FIGS. may be described with reference to this coordinate system, e.g., the view shown in FIG. 1 is in the y-z plane, as indicated with y and z axes shown at the lower left corner of FIG. 1. The coordinate system 105 is not shown in subsequent FIGS. in order to not clutter the drawings.

The IC device 100 may be referred to as a "three-dimensional memory array" 100 because, as explained below, it includes different planar memory arrays having portions included in at least two different layers shown in FIG. 1.

As shown in FIG. 1, the IC device 100 may include an FEOL 110 that includes most of the various logic layers, circuits, and devices to drive and control a logic IC. As also shown in FIG. 1, the IC device 100 also includes a BEOL 120 that may include, in the example illustration of one embodiment of the present disclosure, seven metal interconnect layers: metal 1 (M1) layer 125, metal 2 (M2) layer 130, metal 3 (M3) layer 135, metal 4 (M4) layer 140, metal 5 (M5) layer 145, metal 6 (M6) layer 150, metal 7 (M7) layer 155, and metal 8 (M8) layer 160. Although eight metal interconnect layers are shown in FIG. 1, in various embodiments, the IC device 100 may include any other number of two or more of such metal interconnect layers. Various metal layers of the BEOL 120 may be used to interconnect the various inputs and outputs of the FEOL 110 and, according to embodiments of the present disclosure, may be used to house different planar memory arrays, or portions thereof.

Implementations of the present disclosure, e.g., implementations of the IC device 100, may be formed or carried out on a support structure, which may be, e.g., a substrate, a die, a wafer or a chip. The substrate may, e.g., be the wafer 2000 of FIG. 7A, discussed below, and may be, or be included in, a die, e.g., the singulated die 2002 of FIG. 7B, discussed below. The substrate may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which a three-dimensional memory array with layer selector transistors as described herein may be built falls within the spirit and scope of the present disclosure. In various embodiments, any of the devices (e.g., transistors) of the FEOL 110 may include, or may be formed upon, any such substrate material that provides a suitable surface for forming the devices.

Generally speaking, each of the metal layers of the BEOL 120, e.g., each of the layers M1-M8 shown in FIG. 1, may include a via portion and a trench/interconnect portion. Typically, the trench portion of a metal layer is above the via portion, which is shown in some cross-section illustration of subsequent figures but, in other embodiments, a trench portion may be provided below a via portion of any given metal layer of the BEOL 120. The trench portion of a metal layer is configured for transferring signals and power along metal lines (also sometimes referred to as "trenches") extending in the x-y plane (e.g., in the x or y directions), while the via portion of a metal layer is configured for transferring signals and power through metal vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL 120, e.g., layers M1-M8 shown in FIG. 1, include only certain patterns of conductive metals, e.g., copper (Cu) or aluminum (Al), or metal alloys, or more generally, patterns of an electrically conductive material, formed in an insulating medium such as ILD. The insulating medium may include any suitable ILD materials such as silicon oxide, silicon nitride, aluminum oxide, and/or silicon oxynitride.

As also shown in FIG. 1, the IC device 100 may be further divided into a memory array 190 and a memory peripheral circuit 180. The memory peripheral circuit 180 may be built in the FEOL 110 and lower metal layers of the BEOL 120, e.g., M1-M4 layers, to control (e.g., access (read/write), store, refresh) the memory cells of the memory array 190. The memory array 190 may be a three-dimensional memory array built in higher metal layers of the BEOL 120, e.g., in M5-M8 layers. As such, the memory array 190 may include memory cells with access transistors and capacitors, as well as wordlines (e.g., row selectors), bitlines (e.g., column selectors), and various layer selector transistors, as described in greater detail below.

Compared to other memory designs that locate a memory control circuit in the same layers as a memory array but in a different macro (or x-y) area of the integrated circuit than the memory array (such as at a periphery of the memory array), the IC device 100 may advantageously locate the memory peripheral circuit 180 below the memory array 190 (e.g., substantially in the same x-y area), thus saving valuable x-y area in the finished IC. In further detail, the IC device 100 may embed stacked planar memory arrays with layer selector transistors in various higher metal layers, e.g., M5, M6, M7, and M8 layers shown in FIG. 1. In some embodiments, bitlines coupled to the access transistors of different memory cells of a given planar memory array may be provided in the same metal layer as such access transistors, the bitlines extending in the x-y plane, e.g., in the y direction, to sense/read each of the memory cells (bits) in the selected row and/or to write memory data to any of the memory cells in the selected row of that planar memory array. In some embodiments, wordlines coupled to the access transistors may be provided in a metal layer below the one containing the access transistors, where wordlines can serve as or connect to the gate electrodes or contacts of the access transistors. Thus, as explained in greater detail below, for at least some of the stacked planar memory arrays described herein, an access transistor can be fabricated above a wordline that may serve as or connect to a gate electrode/contact of the access transistor, and below a bitline that may serve as S/D electrode/contact. For example, a given access transistor may have a transistor gate below a thin film channel material, and source and drain contacts above the thin film layer.

In other embodiments of the IC device 100, the memory peripheral circuit 180 and the memory array 190 may occupy other number and/or other metal layers in the BEOL 120 than what is shown in the example of FIG. 1. In still other embodiments of the IC device 100, at least portions of the memory peripheral circuit 180 and the memory array 190 may occupy one or more of the same metal layers in the BEOL 120. In some embodiments of the IC device 100, the memory peripheral circuit 180 and the memory array 190 may be provided in the same one or more metal layers in the BEOL 120.

In some embodiments, any of the electrically conductive structures/interconnects described herein, such as various wordlines or bitlines of different planar memory arrays of a three-dimensional memory array, or deep vias interconnecting layer selector transistors of different layers, may be at least partially surrounded by diffusion barriers or diffusion barrier layers. Such diffusion barriers/layers may include dielectric materials/layers, such as silicon nitride, silicon carbide, or the like, e.g., with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like.

FIGS. 2A-2B are cross-sectional (y-z plane) and plan (y-x plane) views, respectively, of an example access transistor 170, implemented as a TFT, of an example memory cell (e.g., eDRAM memory cell) 250, according to some embodiments of the present disclosure. FIGS. 3A-3B are cross-sectional views (x-z and y-z planes) of an example structure of the access transistor in the memory cell of FIGS. 2A-2B, according to some embodiments of the present disclosure. The memory cell 250 shown in FIGS. 2 and 3 is an example of a memory cell that may be implemented in different planar memory arrays stacked to realize a three-dimensional architecture (i.e., when different memory cells such as the one shown in FIGS. 2 and 3 are first arranged in rows and columns to form a planar memory array and then different planar memory arrays are stacked in different layers above a substrate), e.g. the IC device 100.

In general, the access transistor 170 of each of the memory cells, as well as the layer selector transistors described below, may be a field-effect transistor (FET), e.g., a metal oxide semiconductor (MOS) FET (MOSFET) or a thin-film transistor (TFT), which is a three-terminal device that includes source, drain, and gate terminals and uses electric field to control current flowing through the device. A FET typically includes a channel material, a source region and a drain regions provided in the channel material, and a gate stack that includes a gate electrode material, alternatively referred to as a "work function" (WF) material, provided over a portion of the channel material between the source and the drain regions, and, optionally, also includes a gate dielectric material between the gate electrode material and the channel material. This general structure is shown for the access transistor 170 of FIG. 3, illustrating a channel material 218, S/D regions 260 (shown as a first S/D region 260-1, e.g., a drain region, and a second S/D region 260-2, e.g., a source region), and a gate stack 250, which includes at least a gate electrode 214 and may also, optionally, include a gate dielectric 216. FIG. 3 also illustrates contacts to the S/D regions 260, shown as a bitline 230 coupled to, or providing a contact for, the first S/D region 260-1 and a storage node 240 coupled to, or providing a contact for, the second S/D region 260-2.

Turning to the details of FIG. 2 first, a memory cell 250 may include a wordline 220 to supply a gate signal, and an access transistor 170 that includes a channel material and is configured to control transfer of a memory state of the memory cell between a first region and a second region of the channel material in response to the gate signal (channel material and first and second regions described in greater detail below, e.g., with reference to FIG. 3). In some embodiments, the access transistor 170 may be above the wordline 220 coupled to the memory cell 250. As also shown in FIG. 2, the memory cell 250 may further include a bitline 230 to transfer the memory state and coupled to and above the first region of the channel material of the access transistor 170, and a storage node 240 coupled to and above the second region of the channel material of the access transistor 170. Although not specifically shown in FIG. 2, in some embodiments, the memory cell 250 may further include a capacitor, e.g., a metal-insulator-metal (MIM) capacitor coupled to and above the storage node 240 and configured to store the memory state of the memory cell 250. In other embodiments, such a capacitor may realize the storage node 240 itself (i.e., the storage node 240 may be implemented as a capacitor).

Turning to the details of FIG. 2, the access transistor 170 in the memory cell 250 may be coupled to or controlled by wordline 220, which, in some embodiments, may serve as the gate of the access transistor 170. A bitline 230 may be coupled to one of the S/D electrodes (which may also be referred to as "contacts" or "terminals") of the access transistor 170 and a storage node 240 may be coupled to the other one of the S/D electrodes. As is commonly known, source and drain terminals are interchangeable in transistors. Therefore, while some examples and illustrations may be presented here with reference to the bitline 230 coupled to the drain terminal and the storage node 240 coupled to the source terminal of the access transistor 170, in other embodiments, this may be reversed. For the following explanations, assume that the bitline 230 may serve as the drain contact and the storage node 240 may serve as the source contact of the access transistor 170. In some embodiments, the wordline 220 may be formed in a given metal layer of the BEOL 120 of the IC device 100 shown in FIG. 1, e.g., substantially with the same process used to fabricate same metal layer for the rest of the IC device 100, the access transistor 170 may be formed in the metal layer above that of the wordline 220, e.g., in the via portion of said metal layer, and the storage node 240 and bitline 230 may also be formed in the metal layer above that of the wordline 220, e.g., in the trench portion of said layer. The bitlines 230 can be connected to sense amplifiers and other bitline drivers below the memory array 190. For example, for the memory cells 250 of a first planar memory array described herein, the wordline 220 may be formed in the M5 layer of the BEOL 120, while the access transistor 170, the storage node 240, and the bitline 230 may be formed in the M6 layer; while for the memory cells 250 of a second planar memory array, stacked over the first planar memory array, the wordline 220 may be formed in the M7 layer of the BEOL 120, while the access transistor 170, the storage node 240, and the bitline 230 may be formed in the M8 layer. In general, for a given memory cell 250 of a given planar memory array described herein, the wordline 220 may be formed in a metal layer $M_x$ of the BEOL 120 (where x is an integer indicating a specific layer), while the access transistor 170, the storage node 240, and the bitline 230 may be formed in a metal layer $M_{x+1}$, i.e., the metal layer above the metal layer $M_x$, e.g. directly above the metal layer $M_x$ (as illustrated in FIGS. 2 and 3).

FIGS. 3A-3B illustrate further details of the access transistor 170. As shown in FIGS. 3A-3B, in some embodiments, the access transistor 170 may be provided substantially above the wordline 220. In some embodiments, the access transistor 170 may be a bottom-gated transistor, e.g., a bottom-gated TFT, in that its gate stack 250 that includes at least a gate electrode 214 and, optionally, also a gate dielectric 216, may be provided below its channel material (also referred to as "active layer") 218. For example, the gate stack of the access transistor 170 may be provided between the channel material 218 and the FEOL 110. The channel material 218 may be between the gate stack 250 and each of the bitline 230 and the storage node 240, as shown in FIG. 3. The bitline 230 may be electrically coupled to a first S/D region 260-1 (e.g., the drain region) of the access transistor 170 and the storage node 240 may be electrically coupled to a second S/D region 260-2 (e.g., the source region) of the access transistor 170. Again, in other embodiments, this example designation of source and drain may be reversed. Thus, the bitline 230 may form, or be coupled to, the first S/D terminal/electrode of the access transistor 170, while the storage node 240 may form, or be coupled to, the second S/D terminal/electrode of the access transistor 170. In such implementations, the wordline 220 may be between the substrate or the FEOL 110 and the gate electrode 214, and the bitline 230 may be further away from the substrate or the FEOL 110 than the channel material 218.

In some embodiments, the channel material 218 may be composed of semiconductor material systems including, for example, N-type or P-type materials systems. In some embodiments, the channel material 218 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 218 may include a combination of semiconductor materials. In some embodiments, the channel material 218 may include a monocrystalline semiconductor, such as silicon (Si) or germanium (Ge). In some embodiments, the channel material 218 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (e.g., for the embodiments where the access transistor 170 is an N-type metal oxide semiconductor (NMOS) transistor), the channel material 218 may advantageously include a III-V material having a high electron mobility, such as, but not limited to InGaAs, InP, InSb, and InAs. For some such embodiments, the channel material 218 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material 218 may be an intrinsic III-V material, i.e., a III-V semiconductor material not intentionally doped with any electrically active impurity. In alternate embodiments, a nominal impurity dopant level may be present within the channel material 218, for example to further fine-tune a threshold voltage Vt, or to provide HALO pocket implants, etc. Even for impurity-doped embodiments however, impurity dopant level within the channel material 218 may be relatively low, for example below $10^{15}$ dopant atoms per cubic centimeter ($cm^{-3}$), and advantageously below $10^{13}$ $cm^{-3}$.

For some example P-type transistor embodiments (e.g., for the embodiments where the access transistor 170 is a P-type metal oxide semiconductor (PMOS) transistor), the channel material 218 may advantageously be a group IV material having a high hole mobility, such as, but not limited to Ge or a Ge-rich SiGe alloy. For some example embodiments, the channel material 218 may have a Ge content between 0.6 and 0.9, and advantageously may be at least 0.7. In some embodiments with highest mobility, the channel material 218 may be intrinsic III-V (or IV for P-type devices) material and not intentionally doped with any electrically active impurity. In alternate embodiments, one or more a nominal impurity dopant level may be present within the channel material 218, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

If the access transistor 170 is a TFT, the channel material 218 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the access transistor 170 is a TFT, the channel material 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some such embodiments, the channel material 218 may have a thickness between about 5 and 75 nanometers, including all values and ranges therein. In some such embodiments, a thin film channel material 218 may be deposited at relatively low temperatures, which allows depositing the channel material 218 within the thermal budgets imposed on back end fabrication to avoid damaging other components, e.g., front end components such as the logic devices.

In some embodiments, the S/D regions 260 of the access transistor 170 may be regions of doped semiconductors, e.g. regions of the channel material 218 (e.g., of the channel portion 114) doped with a suitable dopant to a suitable dopant concentration, so as to supply charge carriers for the transistor channel. In some embodiments, the S/D regions 260 may be highly doped, e.g. with dopant concentrations of about $1 \cdot 10^{21}$ cm$^{-3}$, in order to advantageously form Ohmic contacts with the respective S/D contacts, although, in other embodiments, these regions may also have lower dopant concentrations and may form Schottky contacts in some implementations. Irrespective of the exact doping levels, the S/D regions 260 may be the regions having dopant concentration higher than in other regions, e.g. higher than a dopant concentration in a region of the channel material 218 between the first S/D region 260-1 and the second S/D region 260-2, and, therefore, may be referred to as "highly doped" (HD) regions. In some embodiments, the S/D regions 260 may generally be formed using either an implantation/diffusion process or an etching/deposition process.

The S/D electrodes/contacts of the access transistor 170, shown in various figures as provided by the corresponding bitline 230 and the source node 240, respectively, may include any suitable electrically conductive material, alloy, or a stack of multiple electrically conductive materials. In some embodiments, the S/D electrodes of the access transistor 170 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes of the access transistor 170 may include one or more electrically conductive alloys, oxides, or carbides of one or more metals. In some embodiments, the S/D electrodes of the access transistor 170 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access transistor 170 may have a thickness (i.e., dimension measured along the z-axis of the example coordinate system shown in the FIGS.) between about 2 nanometers and 1000 nanometers, preferably between about 2 nanometers and 100 nanometers.

In some embodiments, e.g., when the access transistor 170 is a TFT, the gate dielectric 216 may laterally surround the channel material 218, and the gate electrode 214 may laterally surround the gate dielectric 216 such that the gate dielectric 216 is disposed between the gate electrode 214 and the channel material 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the access transistor 170 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel material 218. In such embodiments, the IGZO may be in contact with the channel material 218, and may provide the interface between the channel material 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the access transistor 170 is a PMOS transistor or an NMOS transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated access transistor 170 may further, optionally, include layers such as a diffusion barrier layer 212, which may be surrounded by a layer of etch resistant material (e.g., an etch stop layer 211). In some embodiments, the diffusion barrier 212 may be a metal- or copper-diffusion barrier (e.g., a conductive material to reduce or prevent the diffusion of metal or copper from wordline 220 into the gate electrode 214 while still maintaining an electrical connection between the wordline 220 and the gate electrode 214) on the wordline 220 such as TaN, tantalum (Ta), titanium zirconium nitride (e.g., $Ti_xZr_{1-x}N$, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum(Ta) and nitrogen(n), such as TaN or a layer of TaN on a layer of Ta. In some embodiments, a layer of etch resistant material (e.g., the etch stop 211) such as silicon nitride or silicon carbide may be formed over the wordline 220 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

Coupling Shared Lines Across Different Layers Using Layer Selector Transistors

As described above, according to various embodiments of the present disclosure, different memory cells 250 may be arranged in planar memory arrays provided in different layers above the substrate, e.g., in different layers above the FEOL 110 of the IC device 100, thus realizing a three-dimensional memory array, e.g., the three-dimensional memory array 190. Furthermore, in various embodiments, some of the lines may be shared among (i.e., may be common to) multiple memory cells of a given planar memory array, and some shared lines of the planar memory arrays of different layers may be coupled to one another using layer selector transistors, thus enabling more efficient use of space and resources. Three examples of such sharing are illustrated in FIGS. 4, 5, and 6.

Figure 4A:
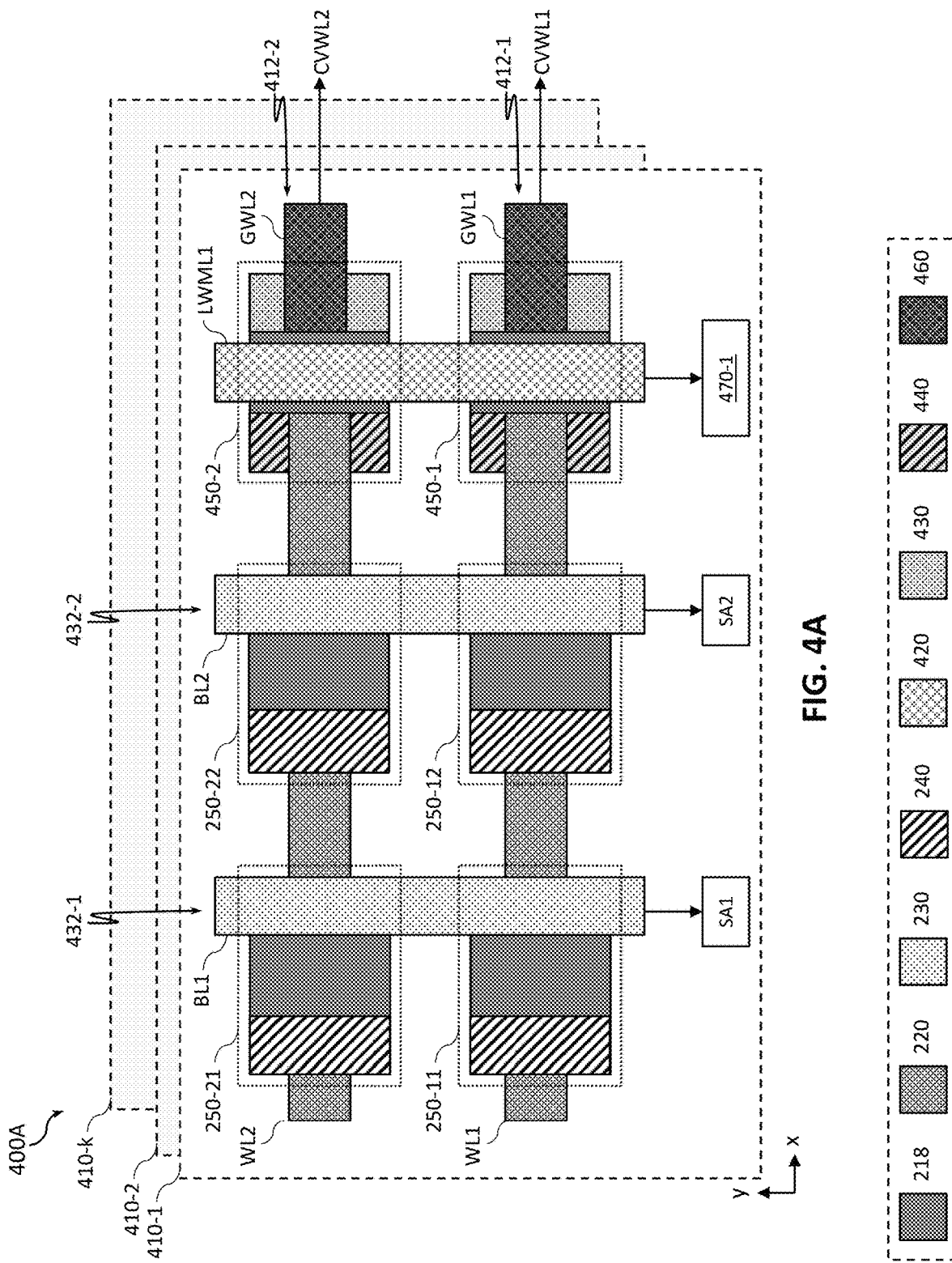
FIG. 4A is a schematic illustration of a top-down view of stacked 2×2 memory arrays with common wordlines coupled across different layers using layer selector transistors, according to some embodiments of the present disclosure.
Figure 5A:
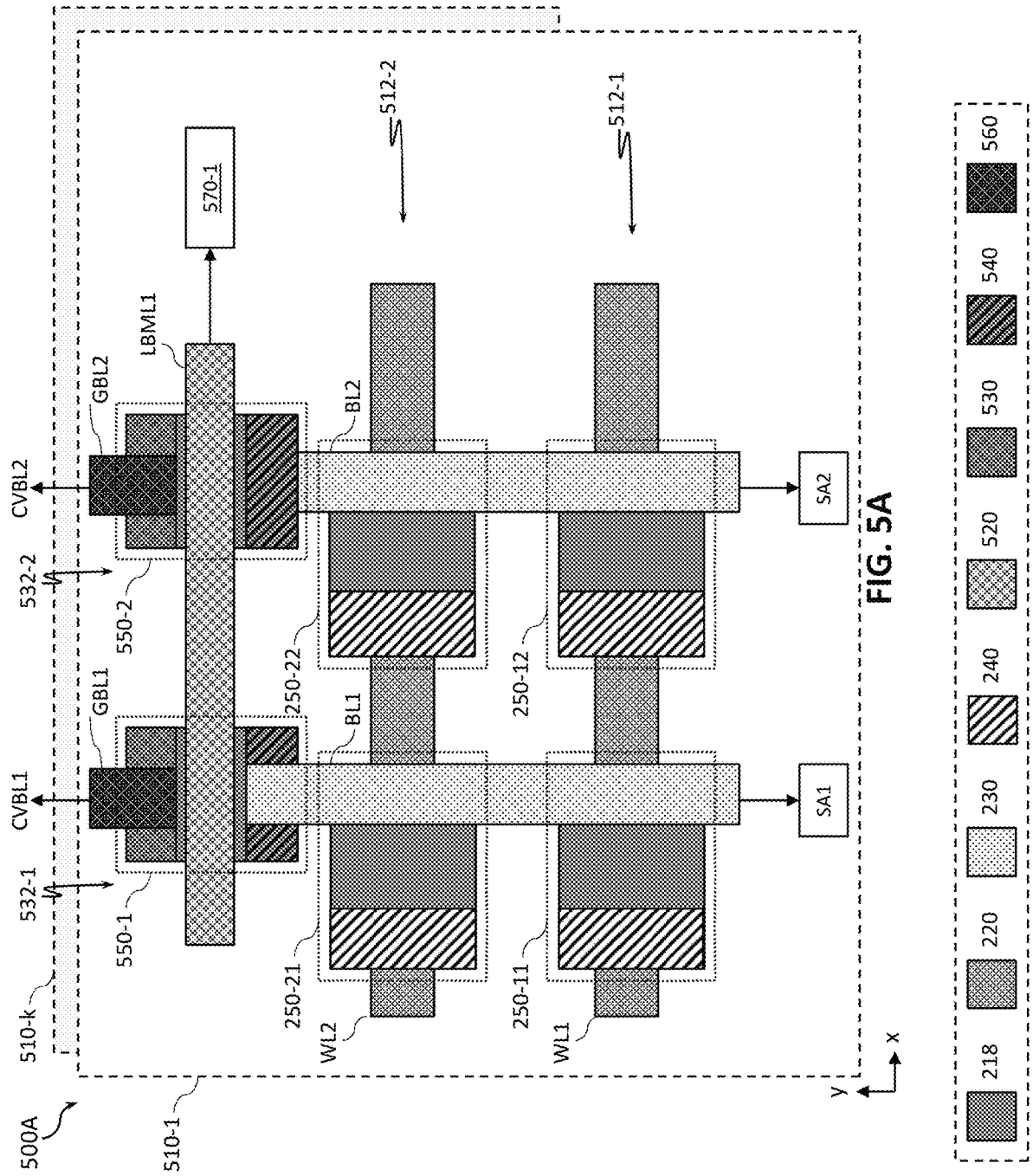
FIG. 5A is a schematic illustration of a top-down view of stacked 2×2 memory arrays with common bitlines coupled across different layers using layer selector transistors, according to some embodiments of the present disclosure.
Figure 6A:
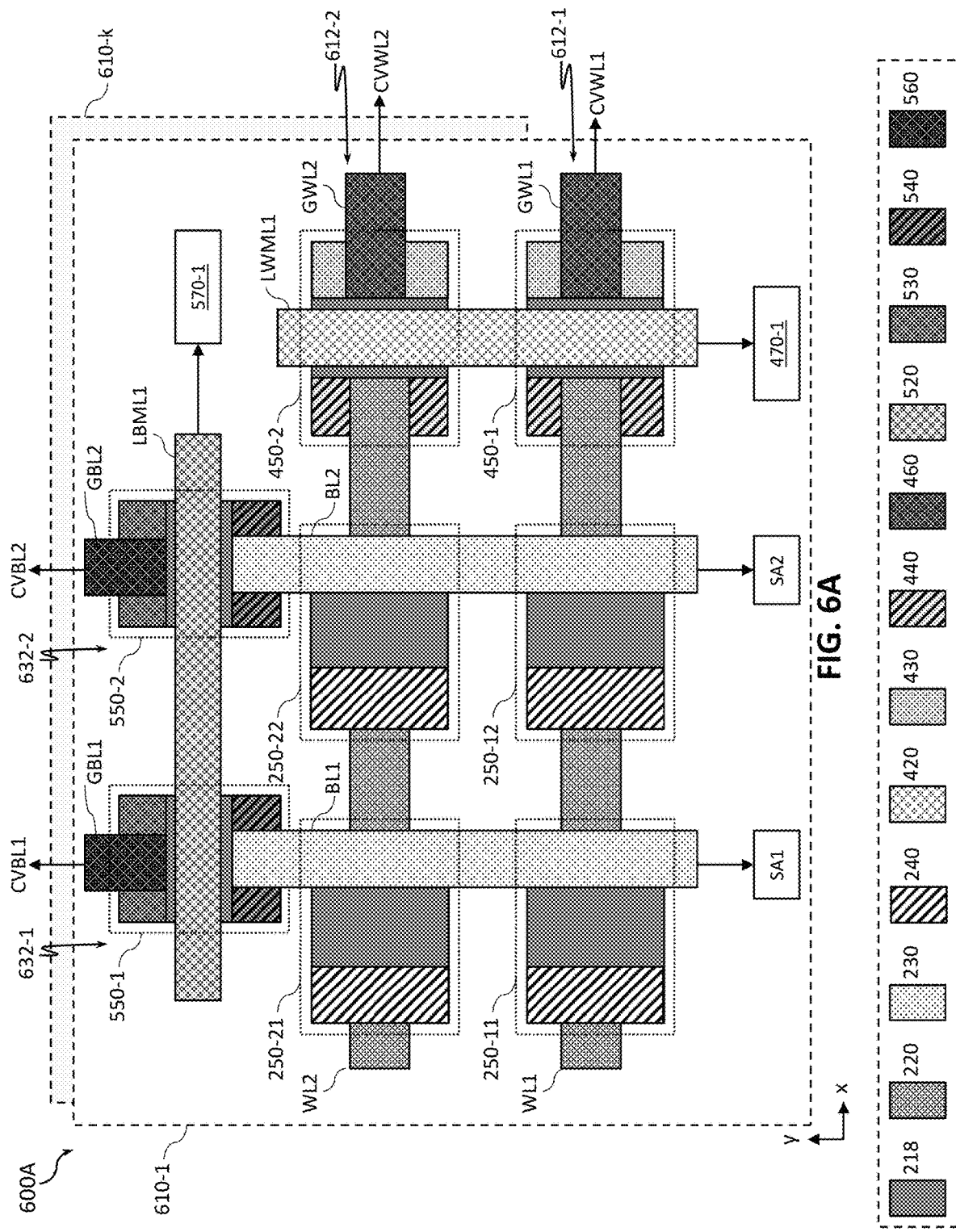
FIG. 6A is a schematic illustration of a top-down view of stacked 2×2 memory arrays with common wordlines and common bitlines coupled across different layers using layer selector transistors, according to some embodiments of the present disclosure.

Each of FIGS. 4A, 5A, and 6A provides a top-down view of example configurations of different common/shared lines coupled across different layers using layer selector transistors to realize a three-dimensional memory array, which could be an example implementation of the memory array 190 of the IC device 100. In particular FIG. 4A illustrates an embodiment of a three-dimensional memory array 400A with common wordlines coupled across different layers using layer selector transistors, FIG. 5A illustrates an embodiment of a three-dimensional memory array 500A with common bitlines coupled across different layers using layer selector transistors, and FIG. 6A illustrates an embodiment of a three-dimensional memory array 600A with common wordlines and common bitlines coupled across different layers using layer selector transistors (e.g., the embodiment of FIG. 6A may be seen as a combination of embodiments of FIG. 4A and FIG. 5A).

Figure 4B:
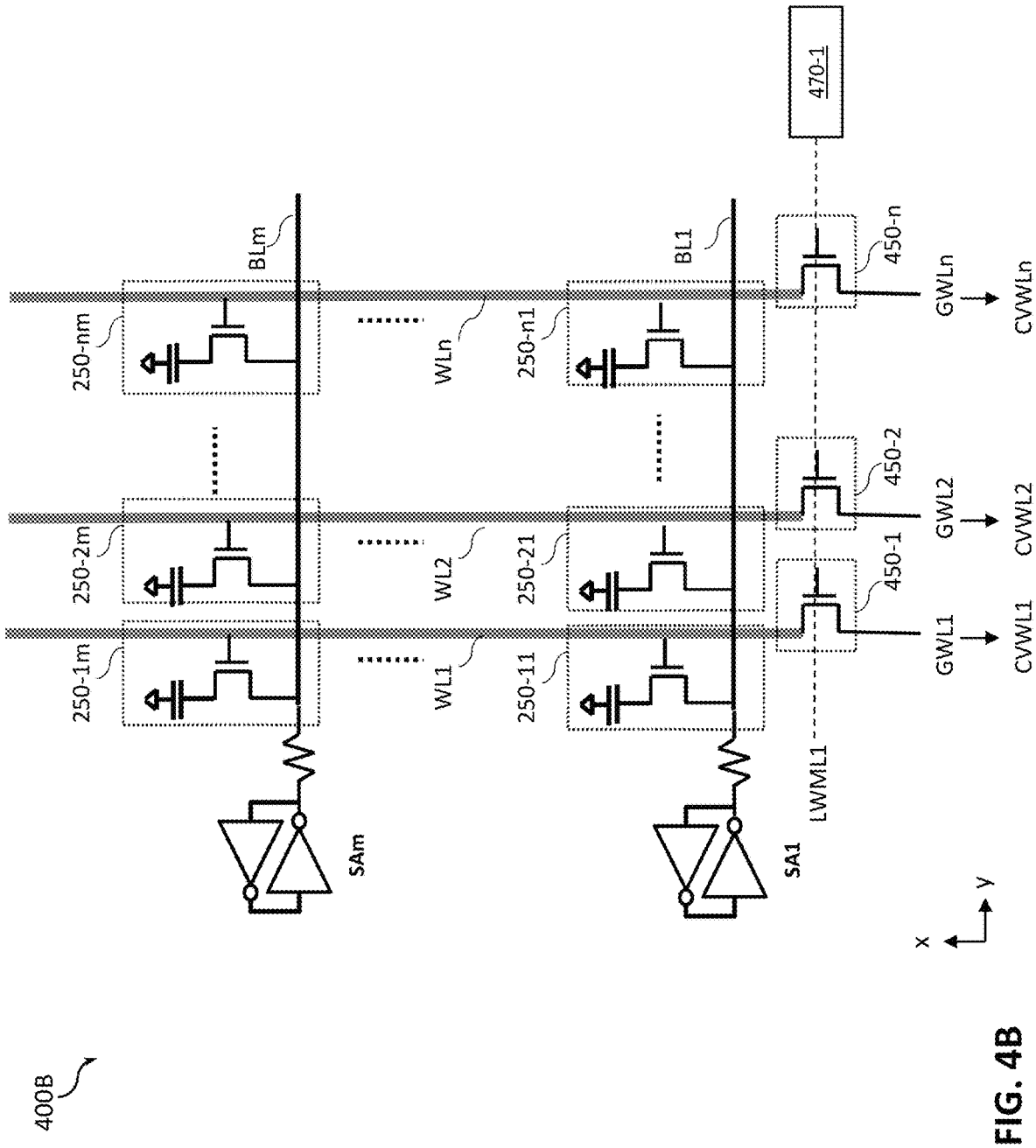
FIG. 4B is an electric circuit diagram of stacked n×m memory arrays with common wordlines coupled across different layers using layer selector transistors, according to some embodiments of the present disclosure.
Figure 5B:
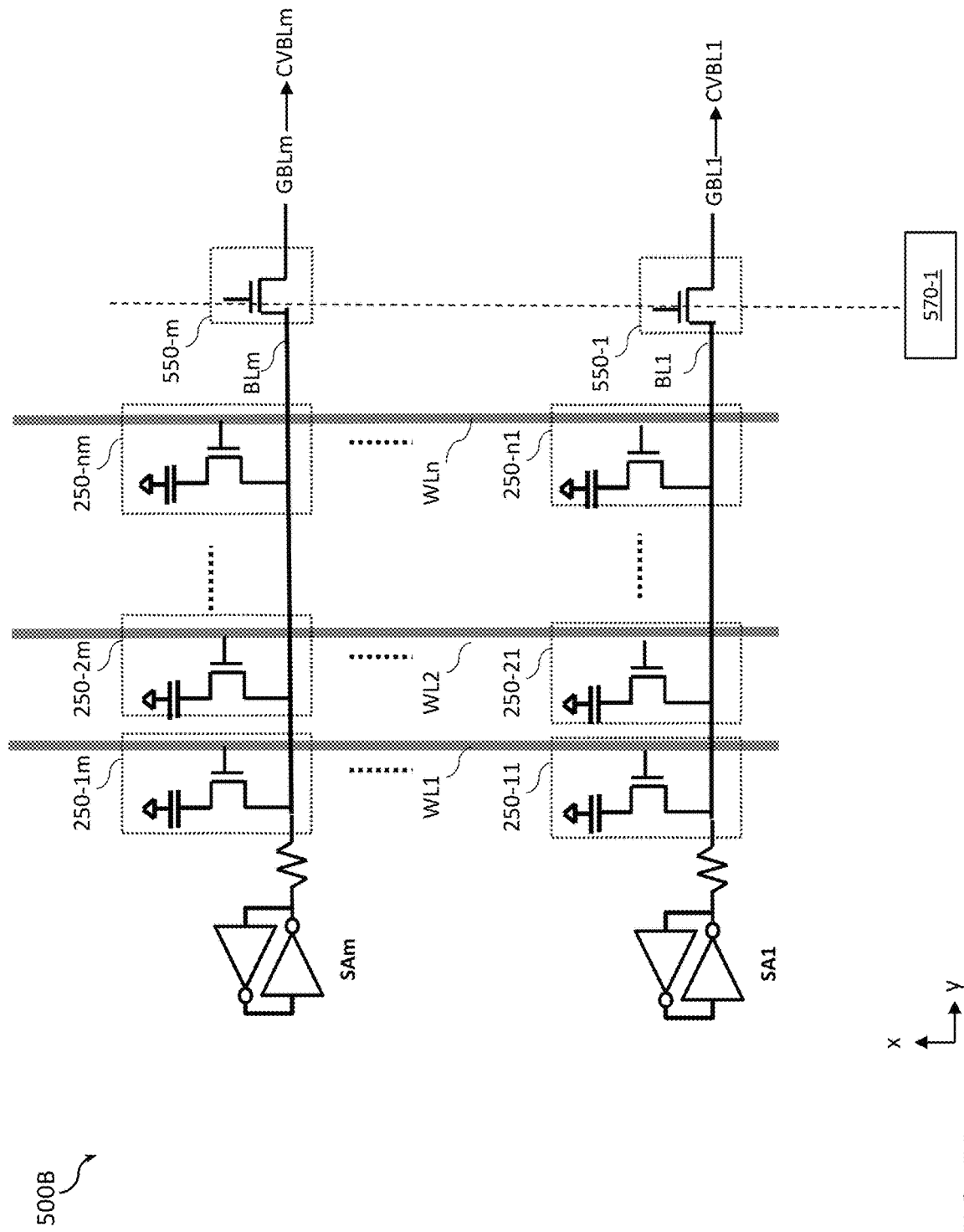
FIG. 5B is an electric circuit diagram of a top-down view of stacked n×m memory arrays with common bitlines coupled across different layers using layer selector transistors, according to some embodiments of the present disclosure.
Figure 6B:
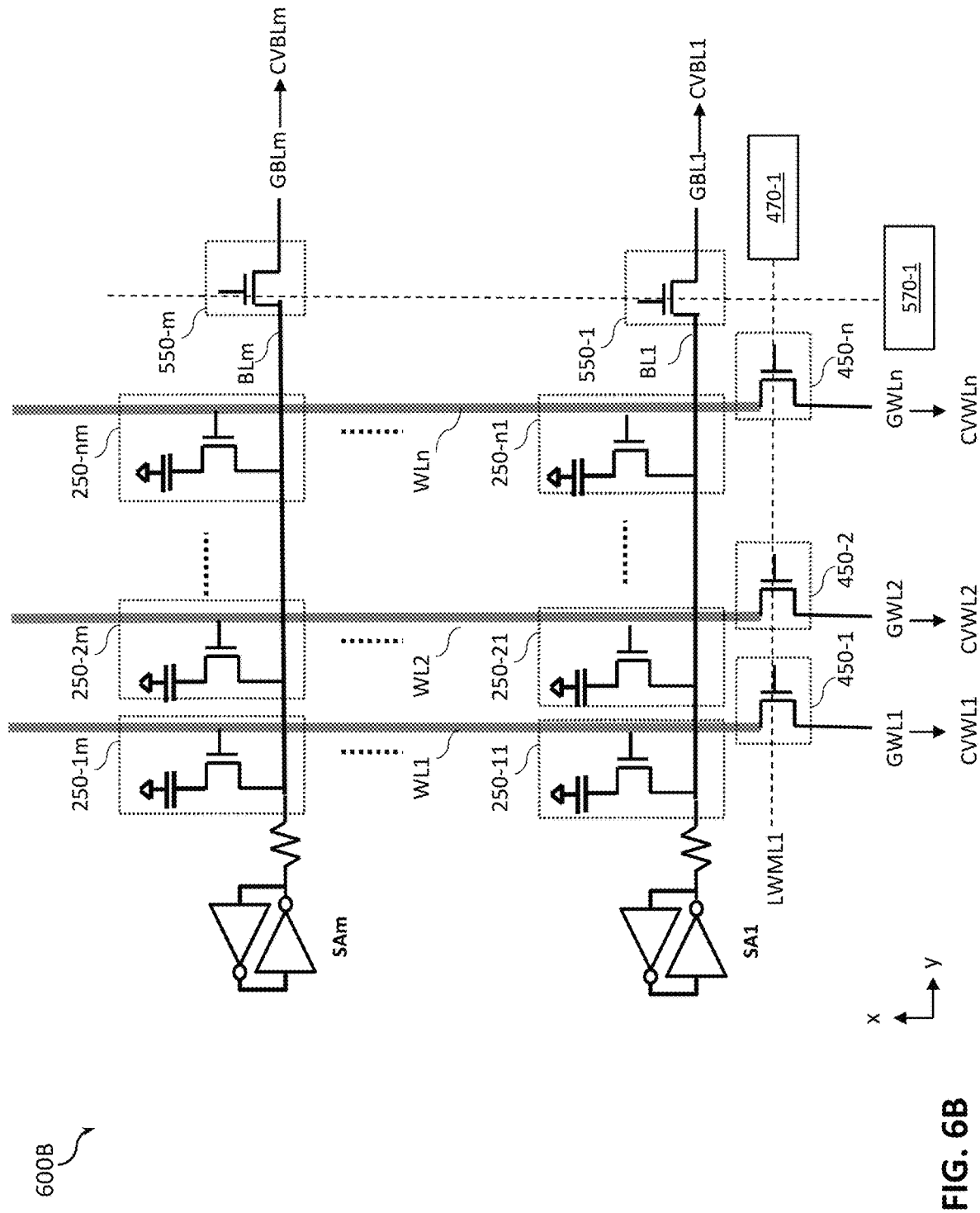
FIG. 6B is an electric circuit diagram of a top-down view of stacked n×m memory arrays with common wordlines and common bitlines coupled across different layers using layer selector transistors, according to some embodiments of the present disclosure.
Figure 6C:
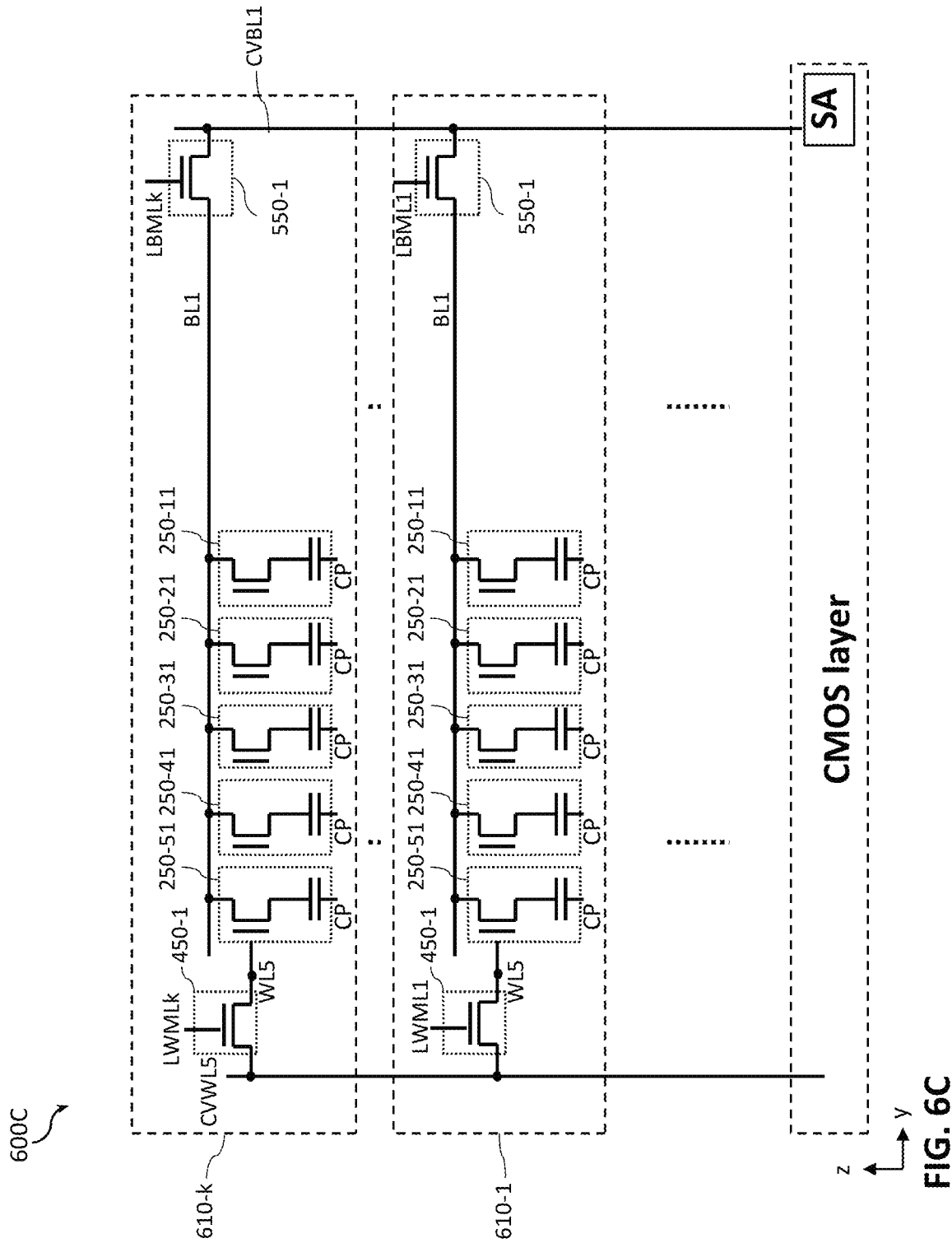
FIG. 6C is an electric circuit diagram of a cross-sectional side view of stacked n×m memory arrays with common wordlines and common bitlines coupled across different layers using layer selector transistors, according to some embodiments of the present disclosure.

Each of FIGS. 4B, 5B, and 6B provides an electric circuit diagram of different common/shared lines coupled across different layers using layer selector transistors to realize a three-dimensional memory array. In particular FIG. 4B illustrates an embodiment of an electric circuit diagram of a three-dimensional memory array 400B with common wordlines coupled across different layers using layer selector transistors, FIG. 5B illustrates an embodiment of an electric circuit diagram of a three-dimensional memory array 500B with common bitlines coupled across different layers using layer selector transistors, and FIG. 6B illustrates an embodiment of an electric circuit diagram of a three-dimensional memory array 600B with common wordlines and common bitlines coupled across different layers using layer selector transistors (e.g., the embodiment of FIG. 6B may be seen as a combination of embodiments of FIG. 4B and FIG. 5B). FIG. 6C is an electric circuit diagram of a cross-sectional side view of stacked n×m memory arrays with common wordlines and common bitlines coupled across different layers using layer selector transistors, according to some embodiments of the present disclosure.

Each of FIGS. 4-6 illustrate examples of three-dimensional memory arrays having k planar memory arrays. For example, FIG. 4A illustrates a three-dimensional memory array 400A having k planar memory arrays 410-1 through 410-k, where k is an integer equal to or greater than 2. Similarly, FIG. 5A illustrates a three-dimensional memory array 500A having k planar memory arrays 510-1 through 510-k and FIG. 6A illustrates a three-dimensional memory array 600A having k planar memory arrays 610-1 through 610-k. Thus, the planar memory arrays 410, 510, 610 of FIGS. 4, 5, and 6, respectively, may together be referred to as planar memory arrays "X10" where X is either 4, 5, or 6 to refer to, respectively, the planar memory arrays 410, 510, or 610.

Different planar memory arrays X10 may be stacked above one another (e.g., in the direction of the z-axis of the coordinate system 105), i.e., provided in different layers above the support structure or the FEOL 110. For example, the planar memory array 410-1 may be a bottom array and the planar memory array 410-2 may be a top array, where the bottom array is provided in a first layer above the support structure or the FEOL 110 and the top array is provided in a second layer above the support structure or the FEOL 110. Only the details of one planar memory array (e.g., the array 410-1 shown in FIG. 4A) are shown in FIGS. 4-6, with the other planar memory arrays having analogous/similar arrangements as the memory array for which the details are shown.

Each of the planar memory arrays shown in FIGS. 4-6 may include a plurality of memory cells 250 which may be arranged in rows and columns in an x-y plane. In this manner, different subsets of the memory cells 250 in a given planar memory array may form sub-arrays that may be stacked in a direction perpendicular to a substrate. For example, each of FIGS. 4-6 illustrate that a planar memory array X10 may include memory cells 250-11 and 250-12 arranged in a first row (e.g., a first row 412-1 shown in FIG. 4A) and may further include memory cells 250-21 and 250-22 arranged in a second row (e.g., a second row 412-2 shown in FIG. 4A). These memory cells may also be arranged in columns, e.g., with the memory cells 250-21 and 250-11 belonging to a first column (e.g., a first column 432-1 shown in FIG. 4A) and the memory cells 250-22 and 250-12 belonging to a second column (e.g., a second column 432-1 shown in FIG. 4A). Of course, the number of rows and columns of each of the planar memory arrays X10 shown in FIGS. 4-6 is purely illustrative, and, in other embodiments, any number of rows and columns, each containing any number of one or more memory cells 250 may be used, and, furthermore, additional x-y plane arrays X10 may be stacked over one another besides what is shown in FIGS. 4-6.

Each of the memory cells 250-11, 250-12, 250-21, and 250-22 shown in FIGS. 4-6 may be a different instance of the memory cell 250, described above, showing the channel material 218, the wordlines 220, the bitlines 230, and the storage nodes 240 as described above. Elements 220, 230, and 240 are shown in FIGS. 4A, 5A, and 6A with different patterns, similar to the patterns used in the illustrations of FIGS. 2 and 3. In the following description of FIGS. 4-6, different instances of the wordlines 220 may be referred to, and are labeled in FIGS. 4-6, as wordline 1 (WL1), wordline 2 (WL2), etc. Similarly, different instances of the bitlines 230 may be referred to, and are labeled in FIGS. 4-6, as bitline 1 (BL1), bitline 2 (BL2), etc.

As further shown in FIGS. 4-6, gate regions/electrodes of each of a plurality of memory cells 250 in a given row of a particular x-y plane memory array are coupled to a common (or shared) wordline for that row of that particular x-y plane memory array. Specifically, as shown in FIGS. 4-6, gate terminals of each of the memory cells 250 in the first row of a given planar memory array X10-i (where i is an integer between 1 and k, indicating a given planar memory array, e.g., the array 410-1) are coupled to a common first wordline WL1 of that planar memory array X10-i, gate terminals of each of the memory cells 250 in the second row of the planar memory array X10-i are coupled to a common second wordline WL2 of the memory array X10-i, and so on. As also shown in FIGS. 4-6, one of the S/D regions/electrodes (e.g., the first S/D region 260-1) of each of a plurality of memory cells 250 in a given column of a particular x-y plane memory array are coupled to a common (or shared) bitline for that column of that particular x-y plane memory array. Specifically, as shown in FIGS. 4-6, first S/D regions 260-1 of each of the memory cells 250 in the first column of a given planar memory array X10-i (e.g., the array 410-1) are coupled to a common first bitline BL1 of the memory array X10-i, first S/D regions 260-1 of each of the memory cells 250 in the second column of the memory array X10-i are coupled to a common second bitline BL2 of the memory array X10-i, and so on. In some embodiments, each common bitline may be coupled to a different sense amplifier (SA), as shown in the illustrations of FIGS. 4-6. Although not specifically shown in FIGS. 4-6, each common wordline may be coupled to a different wordline driver.

FIGS. 4-6 further illustrate layer selector transistors 450 and/or 550 which may be used in each of the planar memory arrays X10 to couple various elements of the different planar memory arrays to one another so that at least a portion of the peripheral circuits may be shared between different planar memory arrays. Each of the layer selector transistors 450 and 550 may be a FET and may have a structure similar to that described with reference to the access transistor 250, which descriptions, therefore, not repeated herein the interests of brevity. In particular, FIGS. 4 and 6 illustrate layer selector transistors 450-1 and 450-2, each of which showing a first S/D region 430, a second S/D region 440, analogous to the S/D regions 260-1, 260-2, described above. Furthermore, FIGS. 5 and 6 illustrate layer selector transistors 550-1 and 550-2, each of which showing a first S/D region 530, a second S/D region 540, also analogous to the S/D regions 260-1, 260-2, described above. Because, as described in greater detail below, each of the layer selector transistors 450 of a given planar memory array X10 may be associated with a different row (e.g., a row 412-1 or a row 412-2) of that planar memory array, the layer selector transistors 450 may be referred to as "row pass transistors." On the other hand, because each of the layer selector transistors 550 of a given planar memory array 510 may be associated with a different column 532 (e.g., a column 532-1 or a column 532-2) of that planar memory array, the layer selector transistors 550 may be referred to as "column pass transistors."

The differences between arrangements of FIG. 4, FIG. 5, and FIG. 6 arise from how layer selector transistors 450 and/or 550 may be used to multiplex common wordlines and/or common bitlines of different x-y plane memory arrays. These differences will now be described in the individual sub-sections related to these FIGS.

Example 1: Common Wordlines Coupled Across Different Memory Layers

FIG. 4A is a schematic illustration of a top-down view of a three-dimensional memory array 400A that includes stacked 2×2 memory arrays 410-1 through 410-k with common wordlines coupled across different layers using layer selector transistors 450, according to some embodiments of the present disclosure.

As shown in FIG. 4A, a respective transistor referred to herein as a "row pass transistor" 450 is provided for each row of a given planar memory array (e.g., the memory array 410-1). For example, a first row pass transistor 450-1 is provided for the first row 412-1 of a given memory array (e.g., the memory array 410-1), a second row pass transistor 450-2 is provided for the second row 412-2 of a given memory array (e.g., the memory array 410-1), and so on.

As also shown in FIG. 4A, one of the S/D regions/electrodes of a row pass transistor for a given row of a given memory array may be coupled to the common wordline for that row, while the other one of the S/D regions/electrodes of that row pass transistor is coupled to what is referred to as a "global wordline" (GWL) for that row. For example, for the first row pass transistor 450-1, the first S/D region/electrode 430 may be coupled to the global wordline for the first row 412-1 (labeled in FIG. 4 as "GWL1"), while the second S/D electrode 440 may be coupled to the common wordline for that row, WL1. Similarly, for the second row pass transistor 450-2, the first S/D electrode 430 may be coupled to the global wordline for the second row 412-2 (labeled in FIG. 4 as "GWL2"), while the second S/D electrode 440 may be coupled to the common wordline for that row, WL2. And so on.

FIG. 4A further illustrates that gate electrodes of the row pass transistors 450 for different rows of a given planar memory array may be coupled to a single control line for that memory array, referred to herein as a "layer wordline multiplex line" (LWML) 420 which may be coupled to a respective LWML driver 470 for that memory array. For example, the first memory array 410-1 may include a first LWML (labeled in FIG. 4 as "LWML1") coupled to a first LWML driver 470-1, the second memory array 410-2 may include a second second LWML (LWML2) (not specifically shown in FIG. 4) coupled to a second LWML driver 470-2 (not specifically shown in FIG. 4), and so on.

In such an arrangement, multiplexing across different x-y plane memory arrays 410 may be performed by coupling global wordlines of a given row in different x-y plane memory arrays to one another using what may be referred to as a "common via wordline"(CVWL) for that row for multiple stacked memory arrays. The CVWL for each row may then be coupled to a respective CVWL driver (not specifically shown in FIG. 4A) for that row. For example, CVWL1 may be used to couple GWL1 (i.e., the global wordline for the first row 412-1) of the first memory array 410-1 to GWL1 of the second memory array 410-2, and so on, for the k memory arrays 410. Similarly, CVWL2 may be used to couple GWL2 (i.e., the global wordline for the second row 412-2) of the first memory array 410-1 to GWL2 of the second memory array 410-2, and so on, for the k memory arrays 410.

FIG. 4B is an electric circuit diagram 400B of an individual planar n×m memory array with common wordlines coupled across different layers using row layer selector transistors 450, according to some embodiments of the present disclosure. FIG. 4B complements the illustration of FIG. 4A in that it provides an electric circuit diagram of how a given memory array 410 of FIG. 4A may be implemented, except that instead of the planar memory array 410 being a 2×2 array as shown in FIG. 4A, FIG. 4B illustrates a more general n×m memory array 410 (i.e., a memory array 410 having n rows 412 and m columns 432). Reference numerals and notations used in FIG. 4A are also used in FIG. 4B, thus the descriptions provided with reference to FIG. 4A are applicable to the electric circuit diagram 400B as well and, in the interests of brevity, are not repeated.

A given row of a given planar memory array 410 of the example shown in FIG. 4 may be selected for performing a READ/WRITE operation by applying a suitable signal to the CVWL of that row in all planar memory arrays (to select that row in all of the planar memory arrays 410) and, simultaneously, applying a suitable signal to the LWML of that particular planar memory array 410 to select that planar memory array of all of the memory arrays. For example, the first row 412-1 of the second memory array 410-2 may be selected by the CVWL driver of the first row 412-1 of all memory arrays 410 applying a suitable signal (e.g., logic HIGH) to the CVWL1 and, simultaneously, the second LWML driver 470-2 (i.e., the LWML driver 470 of the second memory array 410-2) applying a suitable signal (e.g., logic HIGH) to the LWML2. That selects all memory cells of a given row of a memory array. A given memory cell 250 within the selected row of the selected memory array may then be selected by applying a suitable signal to the common BL of the column in which that memory cell is located.

To summarize embodiments of the example of using layer selector transistors in the form of row pass transistors, shown in FIG. 4, for a given planar memory array 410, a designated row pass transistor 450 may be associated with each of the rows 412 of the memory cells 250. Thus, a planar memory array 410 with n rows may include n row pass transistors 450, and a three-dimensional memory array 400 with k planar memory arrays 410 may include a total of n×k column pass transistors 450. Furthermore, among different planar memory arrays 410, row pass transistors 450 associated with the same row may be coupled to one another using a designated CVWL for that row. Thus, a three-dimensional memory array 400 in which individual planar memory arrays 410 have n rows may have n CVWLs. Each of the CVWLs described herein may be implemented as any suitable interconnect structure, e.g., using the electrically conductive materials (and, optionally, diffusion barriers) as described with reference to other electrically conductive structures described herein.

Example 2: Common Bitlines Coupled Across Different Memory Layers

FIG. 5A is a schematic illustration of a top-down view of a three-dimensional memory array 500A that includes stacked 2×2 planar memory arrays 510-1 through 510-k with common bitlines coupled across different layers using layer selector transistors 550, according to some embodiments of the present disclosure.

As shown in FIG. 5A, a respective transistor referred to herein as a "column pass transistor" 550 is provided for each column of a given memory array (e.g., the memory array 510-1). For example, a first column pass transistor 550-1 is provided for the first column 532-1 of a given memory array (e.g., the memory array 510-1), a second column pass transistor 550-2 is provided for the second column 532-2 of a given memory array (e.g., the memory array 510-1), and so on.

As also shown in FIG. 5A, one of the S/D regions/electrodes of a column pass transistor for a given column of a given memory array may be coupled to the common bitline for that column, while the other one of the S/D regions/electrodes of that column pass transistor may be coupled to what is referred to as a "global bitline" (GBL) for that column. For example, for the first column pass transistor 550-1, the first S/D electrode 530 may be coupled to the GBL for the first column 532-1 (GBL1), while the second S/D electrode 540 may be coupled to the common bitline for that column, BL1. Similarly, for the second column pass transistor 550-2, the first S/D electrode 530 may be coupled to the GBL for the second column 532-2 (GBL2), while the second S/D electrode 540 may be coupled to the common bitline for that row, BL2. And so on. Thus, the rows 512 shown in FIG. 5 are similar to the rows 412 shown in FIG. 4, except that the rows 512 do not include row pass transistors 450, described with reference to FIG. 4. Similarly, the columns 532 shown in FIG. 5 are similar to the columns 432 shown in FIG. 4, except that the rows 412 do not include column pass transistors 550, described with reference to FIG. 5.

FIG. 5A further illustrates that gate electrodes of column pass transistors 550 for different columns of a given memory array may be coupled to a single control line for that memory array, referred to herein as a "layer bitline multiplex line" (LBML) 520 which may be coupled to a respective LBML driver 570 for that memory array. For example, the first memory array 510-1 may include a first LBML (labeled in FIG. 5 as "LBML1") coupled to a first LBML driver 570-1, the second memory array 510-2 may include a second LBML (LBML2) (not specifically shown in FIG. 5) coupled to a second LBML driver 570-2 (not specifically shown in FIG. 5), and so on.

In such an arrangement, multiplexing across different x-y plane memory arrays may be performed by coupling global bitlines of a given column in different x-y plane memory arrays to one another using what is referred to as a "common via bitline"(CVBL) (shown in FIG. 6C) for that column for multiple stacked memory arrays. The CVBL for each column may then be coupled to a respective SA for that column. For example, CVBL1 may be used to couple GBL1 (i.e., the global bitline for the first column 532-1) of the first memory array 510-1 to GBL1 of the second memory array 510-2, and so on, for the k memory arrays 510. Similarly, CVBL2 may be used to couple GBL2 (i.e., the global bitline for the second column 532-2) of the first memory array 510-1 to GBL2 of the second memory array 510-2, and so on, for the k memory arrays 510.

FIG. 5B is an electric circuit diagram 500B of an individual planar n×m memory array with common wordlines coupled across different layers using column layer selector transistors 550, according to some embodiments of the present disclosure. FIG. 5B complements the illustration of FIG. 5A in that it provides an electric circuit diagram of how a given memory array 510 of FIG. 5A may be implemented, except that instead of the planar memory array 510 being a 2×2 array as shown in FIG. 5A, FIG. 5B illustrates a more general n×m memory array 510 (i.e., a memory array 510 having n rows 512 and m columns 532). Reference numerals and notations used in FIG. 5A are also used in FIG. 5B, thus the descriptions provided with reference to FIG. 5A are applicable to the electric circuit diagram 500B as well and, in the interests of brevity, are not repeated.

A given column of a given planar memory array 510 may be selected for performing a READ/WRITE operation by applying a suitable signal to the CVBL of that column in all memory arrays (to select the column in all of the memory arrays 510) and, simultaneously, applying a suitable signal to the LBML of that particular planar memory array 510 to select a given memory array of all of the memory arrays. For example, the first column 532-1 of the second memory array 510-2 may be selected by the CVBL driver of the first column 532-1 of all memory arrays 510 applying a suitable signal (e.g., logic HIGH) to the CVBL1 and, simultaneously, the second LBML driver 570-2 (i.e., the LBML driver 570 of the second memory array 510-2) applying a suitable signal (e.g., logic HIGH) to the LBML2. Thar selects all memory cells of a given column of a memory array. A given memory cell within the selected column of the selected memory array may then be selected by applying a suitable signal to the common WL of the row in which that memory cell is located.

To summarize embodiments of the example of using layer selector transistors in the form of column pass transistors, shown in FIG. 5, for a given planar memory array 510, a designated column pass transistor 550 may be associated with each of the columns 532 of the memory cells 250. Thus, a planar memory array 510 with m columns may include m column pass transistors 550, and a three-dimensional memory array 500 with k planar memory arrays 510 may include a total of m×k column pass transistors 550. Furthermore, among different planar memory arrays 510, column pass transistors 550 associated with the same column may be coupled to one another using a designated CVBL for that row. Thus, a three-dimensional memory array 500 in which individual planar memory arrays 510 have m columns may have m CVBLs. Each of the CVBLs described herein may be implemented as any suitable interconnect structure, e.g., using the electrically conductive materials (and, optionally, diffusion barriers) as described with reference to other electrically conductive structures described herein.

Example 3: Common Wordlines and Common Bitlines Coupled Across Different Memory Layers FIG. 6A is a schematic illustration of a top-down view of a three-dimensional memory array 600A that includes stacked 2×2 planar memory arrays 610-1 through 610-k with common wordlines coupled across different layers using layer selector transistors 450 and with common bitlines coupled across different layers using layer selector transistors 550, according to some embodiments of the present disclosure. The three-dimensional memory array 600A may be seen as a combination of the three-dimensional memory arrays 400A and 500A (i.e., a combination of the embodiments of FIGS. 4A and 5A) in that each planar memory array 610 includes rows 612 similar to the rows 412 of FIG. 4 and includes columns 632 similar to the columns 532 of FIG. 5. Similarly, the electric circuit diagram 600B shown in FIG. 6B may be seen as a combination of the electric circuit diagrams 400B and 500B (i.e., a combination of the embodiments of FIGS. 4B and 5B). Thus, descriptions provided above with reference to FIG. 4 are applicable to the planar memory arrays 610 and the three-dimensional memory array 600A as far as the functionality of the row pass transistors 450, while descriptions provided above with reference to FIG. 5 are applicable to the planar memory arrays 610 and the three-dimensional memory array 600A as far as the functionality of the column pass transistors 550. Therefore, in the interests of brevity, these descriptions are not repeated here.

While FIG. 6B provides an electric circuit diagram illustrating a particular planar memory array 610, FIG. 6C provides an electric circuit diagram 600C of a cross-sectional side view of k stacked n×m memory arrays 610-1 through 610-k with common wordlines and common bitlines coupled across different layers using layer selector transistors, according to some embodiments of the present disclosure. FIG. 6C may be seen as a different view of the three-dimensional memory array illustrated in FIG. 6B. In particular, example of FIG. 6C illustrates planar memory arrays 610 which include 5 rows. For each of the planar memory arrays 610 shown in FIG. 6C, the memory cell 250-11 belongs to the first row 612-1, the memory cell 250-21 belongs to the second row 612-2, the memory cell 250-31 belongs to the third row 612-3, the memory cell 250-41 belongs to the fourth row 612-4, and the memory cell 250-51 belongs to the fifth row 612-5, in accordance with the notation for numbering the memory cells 250 in the previous illustrations of FIGS. 4-6. Thus, in each of the planar memory arrays 610 shown in FIG. 6C, the memory cells 250-11 through 250-51 form a first column 632-1 of the planar memory array 610. Memory cells of other columns are not shown in FIG. 6C because they would be in a different plane than the plane of the drawing of FIG. 6C.

FIG. 6C illustrates how one of the S/D regions of each of the memory cells 250-11 through 250-51 of the first column 632-1 of the first planar memory array 610-1 are coupled to a common bitline BL1 of the memory array 610-1, while the other one of the S/D regions is coupled to a capacitor, which represents the storage node 240. FIG. 6C further illustrates how one of the S/D regions of each of the memory cells 250-11 through 250-51 of the first column 632-1 of the k-th planar memory array 610-k are coupled to a common bitline BL1 of the memory array 610-k, while the other one of the S/D regions is coupled to a capacitor, which represents the storage node 240. FIG. 6C further illustrates the column pass transistor 550-1 in each of the planar memory arrays 610, the gate of which is coupled to LBML of the respective planar memory array, one S/D region of which is coupled to the common bitline BL1, while the other S/D region of which is coupled to the CVBL1, as described above.

FIG. 6C illustrates how the gate electrode of the memory cell 250-51 of the first planar memory array 610-1 is coupled to a common wordline WL5 of the memory array 610-1, and the gate electrode of the memory cell 250-51 of the k-th planar memory array 610-k is coupled to a common wordline WL5 of the memory array 610-k. Each of these common wordlines WL5 is coupled to a first S/D region of a respective row pass transistor 450-1 of the respective planar array 610, which row pass transistors couple further to the CVWL5 (similar to the CVWL1, described above, but now for the 5$^{th}$ row). Similar coupling for rows 1, 2, 3, and 4 is not specifically shown in FIG. 6C because that would be outside of the plane of the drawing.

Variations and Implementations

Various device assemblies illustrated in FIGS. 1-6 do not represent an exhaustive set of IC devices with three-dimensional memory arrays with layer selector transistors (e.g., row pass transistors and/or column pass transistors) as described herein, but merely provide examples of such structures/assemblies. In particular, the number and positions of various elements shown in FIGS. 1-6 is purely illustrative and, in various other embodiments, other numbers of these elements, provided in other locations relative to one another may be used in accordance with the general architecture considerations described herein. For example, while FIG. 1 illustrates metal layers M1-M8 of the BEOL 120, in other embodiments, other number of metal layers may be included. In another example, while FIGS. 4-6 illustrate specific numbers of memory cells and specific number of stacked arrays, in other embodiments, any other number of memory cells may be included in an IC device implementing a three-dimensional memory arrays with layer selector transistors, with any number of two or more stacked x-y plane memory arrays.

Further, FIGS. 1-6 are intended to show relative arrangements of the elements therein, and the device assemblies of these FIGS. may include other elements that are not specifically illustrated (e.g., various interfacial layers). Similarly, although particular arrangements of materials are discussed with reference to FIGS. 1-6, intermediate materials may be included in the assemblies of these FIGS. Still further, although some elements of the various top down and cross-sectional views are illustrated in FIGS. 2-6 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the three-dimensional memory arrays with layer selector transistors as described herein.

Example Electronic Devices

Arrangements with one or more three-dimensional memory arrays with multiplexing across different layers by implementing layer selector transistors (e.g., row pass transistors and/or column pass transistors) as disclosed herein may be included in any suitable electronic device. FIGS. 7-10 illustrate various examples of devices and components that may include one or more three-dimensional memory arrays with multiplexing across different layers as disclosed herein.

Figures 7A, 7B:
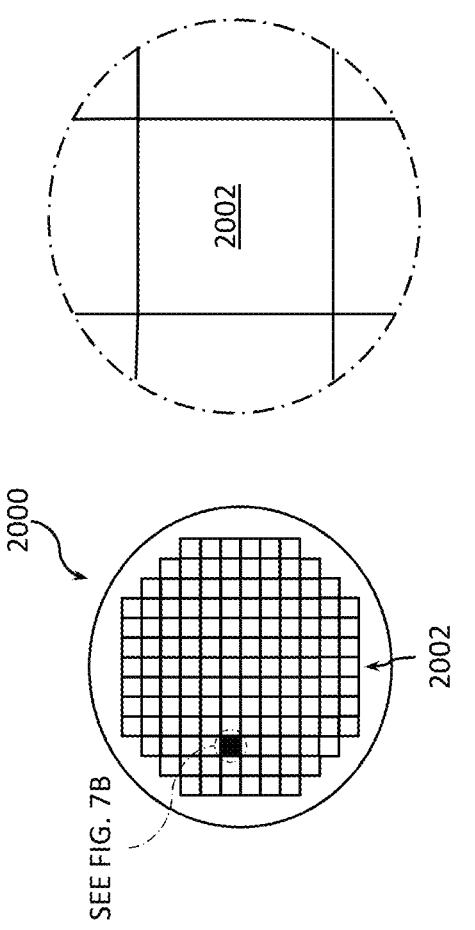
FIGS. 7A-7B are top views of a wafer and dies that include one or more three-dimensional memory arrays with layer selector transistors in accordance with any of the embodiments disclosed herein.

FIGS. 7A-7B are top views of a wafer 2000 and dies 2002 that may include one or more three-dimensional memory arrays with multiplexing across different layers by implementing layer selector transistors (e.g., row pass transistors and/or column pass transistors) in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more three-dimensional memory arrays with layer selector transistors as described herein). After the fabrication of the semiconductor product is complete (e.g., after manufacture of one or more three-dimensional memory arrays with layer selector transistors as described herein (e.g. any embodiment of the memory array 190 of the IC device 100), the wafer 2000 may undergo a singulation process in which each of the dies 2002 is separated from one another to provide discrete "chips" of the semiconductor product. In particular, devices that include one or more three-dimensional memory arrays with layer selector transistors as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 10) or other logic that is configured to store information in the memory devices or execute instructions stored in the memory array.

Figure 8:
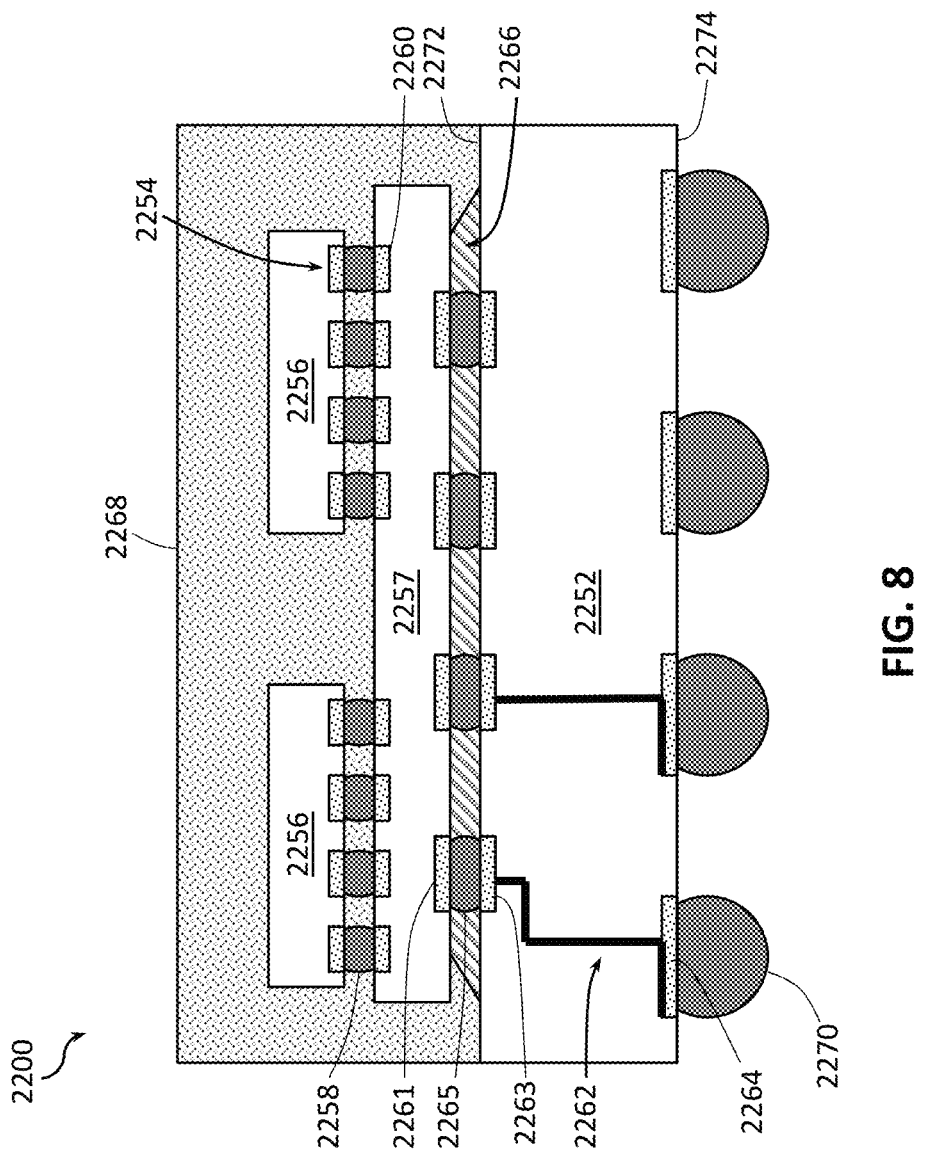
FIG. 8 is a cross-sectional side view of an IC package that may include one or more three-dimensional memory arrays with layer selector transistors in accordance with any of the embodiments disclosed herein.

FIG. 8 is a side, cross-sectional view of an example IC package 2200 that may include one or more three-dimensional memory arrays with multiplexing across different layers by implementing layer selector transistors (e.g., row pass transistors and/or column pass transistors) in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the three-dimensional memory arrays with multiplexing across different layers by implementing layer selector transistors as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more three-dimensional memory arrays with multiplexing across different layers by implementing layer selector transistors, e.g., as discussed above; in some embodiments, at least some of the dies 2256 may not include any three-dimensional memory arrays with multiplexing across different layers by implementing layer selector transistors.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
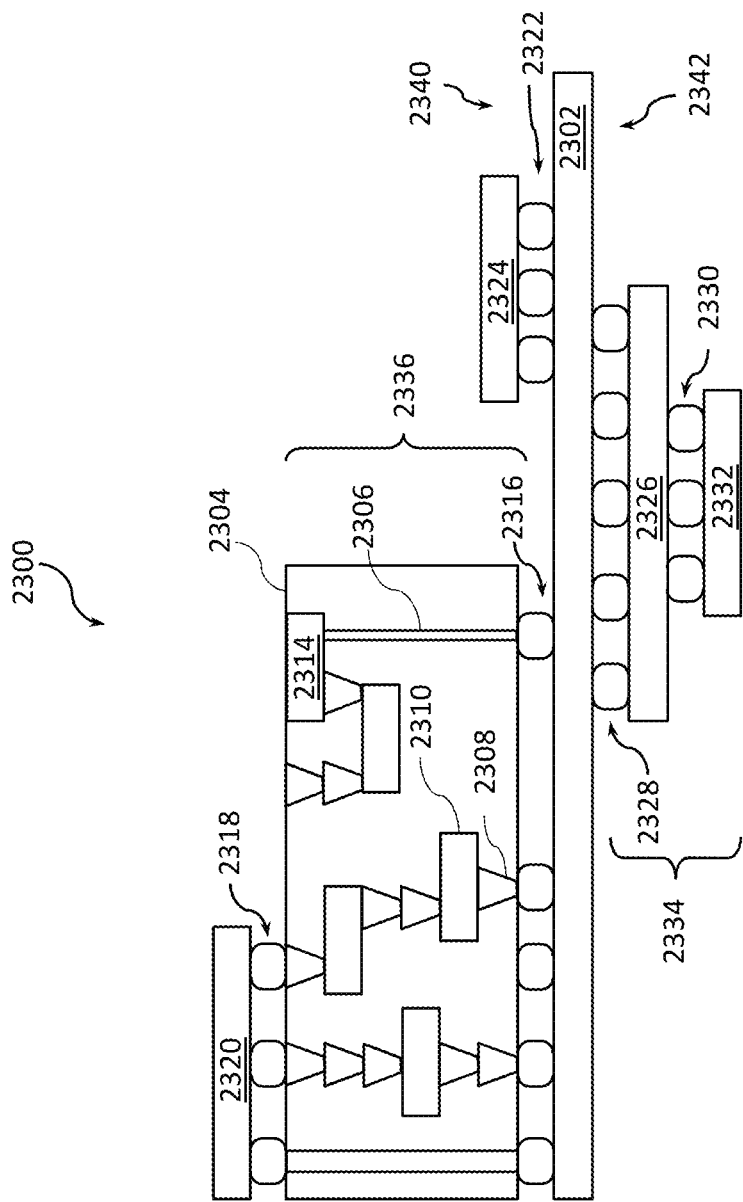
FIG. 9 is a cross-sectional side view of an IC device assembly that may include one or more three-dimensional memory arrays with layer selector transistors in accordance with any of the embodiments disclosed herein.

FIG. 9 is a cross-sectional side view of an IC device assembly 2300 that may include components having one or more three-dimensional memory arrays with multiplexing across different layers by implementing layer selector transistors (e.g., row pass transistors and/or column pass transistors) in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more three-dimensional memory arrays with layer selector transistors in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more three-dimensional memory arrays with layer selector transistors provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7B), an IC device, or any other suitable component. In particular, the IC package 2320 may include one or more three-dimensional memory arrays with layer selector transistors as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
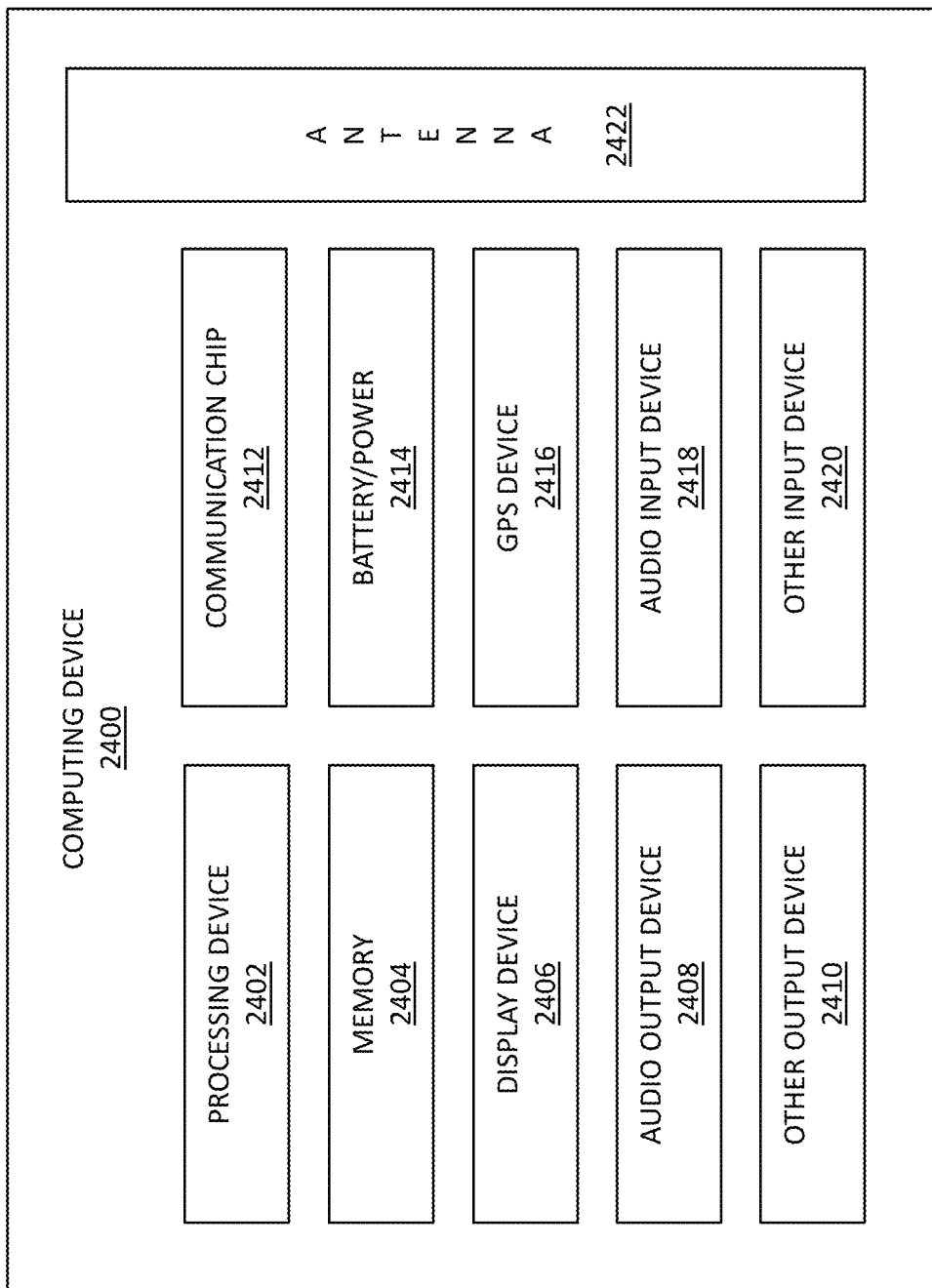
FIG. 10 is a block diagram of an example computing device that may include one or more three-dimensional memory arrays with layer selector transistors in accordance with any of the embodiments disclosed herein.

FIG. 10 is a block diagram of an example computing device 2400 that may include one or more components with one or more three-dimensional memory arrays with layer selector transistors (e.g., row pass transistors and/or column pass transistors) in accordance with any of the embodiments disclosed herein. For example, any suitable ones of the components of the computing device 2400 may include a die (e.g., the die 2002 (FIG. 7B)) including one or more three-dimensional memory arrays with multiplexing across different layers by implementing layer selector transistors in accordance with any of the embodiments disclosed herein. Any of the components of the computing device 2400 may include an IC package 2200 (FIG. 8). Any of the components of the computing device 2400 may include an IC device assembly 2300 (FIG. 9).

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eDRAM, e.g. a three-dimensional memory array with layer selector transistors (e.g., row pass transistors and/or column pass transistors) as described herein, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a first arrangement that includes two or more memory cells, a first transistor, and a first wordline; a second arrangement that includes two or more memory cells, a second transistor, and a second wordline; and an interconnect structure. Each memory cell of the first arrangement and the second arrangement includes an access transistor, a gate electrode of the access transistor of each of the two or more memory cells of the first arrangement is coupled to the first wordline, and the first wordline is coupled to a first source or drain (S/D) region of the first transistor, a gate electrode of the access transistor of each of the two or more memory cells of the second arrangement is coupled to the second wordline, and the second wordline is coupled to a first S/D region of the second transistor, and each of a second S/D region of the first transistor and a second S/D region of the second transistor is coupled to the interconnect structure.

Example 2 provides IC device according to example 1, where the first arrangement further includes a first local interconnect structure, and a gate electrode of the first transistor is coupled to the first local interconnect structure.

Example 3 provides IC device according to example 2, where the first arrangement further includes two or more further memory cells, a further first transistor, and a further first wordline, each memory cell of the two or more further memory cells of the first arrangement includes an access transistor, a gate electrode of the access transistor of each of the two or more further memory cells of the first arrangement is coupled to the further first wordline, the further first wordline is coupled to a first S/D region of the further first transistor, and a gate electrode of the further first transistor is coupled to the first local interconnect structure.

Example 4 provides IC device according to example 3, where the interconnect structure is a first interconnect structure, the IC device further includes a second interconnect structure, a second S/D region of the further first transistor is coupled to the second interconnect structure.

Example 5 provides IC device according to example 4, where the second arrangement further includes two or more further memory cells, a further second transistor, and a further second wordline, each memory cell of the two or more further memory cells of the second arrangement includes an access transistor, a gate electrode of the access transistor of each of the two or more further memory cells of the second arrangement is coupled to the further second wordline, and the further second wordline is coupled to a first S/D region of the further second transistor, and a second S/D region of the further second transistor is coupled to the second interconnect structure.

Example 6 provides IC device according to example 5, where the second arrangement further includes a second local interconnect structure, and a gate electrode of the further second transistor is coupled to the second local interconnect structure.

Example 7 provides IC device according to examples 5 or 6, where the first arrangement further includes an additional first transistor and a first bitline. A second arrangement further includes an additional second transistor and a second bitline. The IC device further includes an additional interconnect structure. A first S/D region of the access transistor of each of one of the two or more memory cells of the first arrangement and one of the two or more further memory cells of the first arrangement is coupled to the first bitline. The first bitline is coupled to a first S/D region of the additional first transistor. A first S/D region of the access transistor of each of one of the two or more memory cells of the second arrangement and one of the two or more further memory cells of the second arrangement is coupled to the second bitline. The second bitline is coupled to a first S/D region of the additional second transistor. Each of a second S/D region of the additional first transistor and a second S/D region of the additional second transistor is coupled to the additional interconnect structure.

Example 8 provides IC device according to any one of the preceding examples, where the IC device further includes a support structure, the first arrangement is in a first layer above the support structure, the second arrangement is in a second layer above the support structure, where the first layer is between the support structure and the second layer, and the interconnect structure is a via extending between the first layer and the second layer.

Example 9 provides IC device according to any one of the preceding examples, where at least one of the first transistor and the second transistor is a thin film transistor (TFT).

Example 10 provides IC device according to example 9, where the TFT includes a channel material that includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

Example 11 provides an IC device that includes a first arrangement that includes two or more memory cells, a first transistor, and a first bitline; a second arrangement that includes two or more memory cells, a second transistor, and a second bitline; and an interconnect structure. Each memory cell of the first arrangement and the second arrangement includes an access transistor, a first source or drain (S/D) region of the access transistor of each of the two or more memory cells of the first arrangement is coupled to the first bitline, and the first bitline is coupled to a first S/D region of the first transistor, a first S/D region of the access transistor of each of the two or more memory cells of the second arrangement is coupled to the second bitline, and the second bitline is coupled to a first S/D region of the second transistor, and each of a second S/D region of the first transistor and a second S/D region of the second transistor is coupled to the interconnect structure.

Example 12 provides IC device according to example 11, where the first arrangement further includes a first local interconnect structure, and a gate electrode of the first transistor is coupled to the first local interconnect structure.

Example 13 provides IC device according to example 12, where the first arrangement further includes two or more further memory cells, a further first transistor, and a further first bitline, each memory cell of the two or more further memory cells of the first arrangement includes an access transistor, a first S/D region of the access transistor of each of the two or more further memory cells of the first arrangement is coupled to the further first bitline, the further first bitline is coupled to a first S/D region of the further first transistor, and a gate electrode of the further first transistor is coupled to the first local interconnect structure.

Example 14 provides IC device according to example 13, where the interconnect structure is a first interconnect structure, the IC device further includes a second interconnect structure, a second S/D region of the further first transistor is coupled to the second interconnect structure.

Example 15 provides IC device according to example 14, where the second arrangement further includes two or more further memory cells, a further second transistor, and a further second bitline, each memory cell of the two or more further memory cells of the second arrangement includes an access transistor, a first S/D region of the access transistor of each of the two or more further memory cells of the second arrangement is coupled to the further second bitline, and the further second bitline is coupled to a first S/D region of the further second transistor, and a second S/D region of the further second transistor is coupled to the second interconnect structure.

Example 16 provides IC device according to example 15, where at least one of the first interconnect structure and the second interconnect structure is perpendicular to a support structure over which the first and the second arrangements are provided.

Example 17 provides an IC device that includes a first memory array including a plurality of memory cells arranged in n rows; a second memory array including a plurality of memory cells arranged in n rows, the second memory array stacked above the first memory array; n first row pass transistors associated with the first memory array so that a different one of the n first row pass transistors is coupled to one of the n rows of the plurality of memory cells of the first memory array; and n second row pass transistors associated with the second memory array so that a different one of the n second row pass transistors is coupled to one of the n rows of the plurality of memory cells of the second memory array, where each one of the n first row pass transistors is coupled to a different one of the n second row pass transistors.

Example 18 provides IC device according to example 17, where the different one of the n first row pass transistors is coupled to the one of the n rows of the plurality of memory cells of the first memory array by having a first source or drain (S/D) region of the different one of the n first row pass transistors being coupled to gate electrodes of all memory cells of the one of the n rows of the plurality of memory cells of the first memory array.

Example 19 provides IC device according to examples 17 or 18, where each one of the n first row pass transistors is coupled to a different one of the n second row pass transistors by having a second S/D region of the each one of the n first row pass transistors being coupled to a second S/D region of the different one of the n second row pass transistors.

Example 20 provides IC device according to any one of examples 17-19, where the plurality of memory cells of the first memory array are further arranged in m columns, the plurality of memory cells of the second memory array are further arranged in m columns, the IC device further includes m first column pass transistors associated with the first memory array so that a different one of the m first column pass transistors is coupled to one of the m columns of the plurality of memory cells of the first memory array, the IC device further includes m second column pass transistors associated with the second memory array so that a different one of the m second column pass transistors is coupled to one of the m rows of the plurality of memory cells of the second memory array, and each one of the m first column pass transistors is coupled to a different one of the m second column pass transistors.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
an arrangement that includes two or more memory cells, a transistor, and a bitline; and
an interconnect structure,
wherein:
an individual memory cell of the arrangement includes an access transistor,
each of the transistor and the access transistor includes a first region and a second region, wherein one of the first region and the second region is a source region and another one of the first region and the second region is a drain region,
the first regions of the access transistors of the two or more memory cells of the arrangement are directly electrically connected to one another and to the bitline, and the bitline is directly electrically connected to the first region of the transistor, and
the second region of the transistor is directly electrically connected to the interconnect structure.

2. The IC device according to claim 1, wherein:
the arrangement further includes a local interconnect structure, and
a gate electrode of the transistor is coupled to the local interconnect structure.

3. The IC device according to claim 2, wherein:
the arrangement further includes two or more further memory cells, a further transistor, and a further bitline,
each memory cell of the two or more further memory cells of the arrangement includes an access transistor,
a first region of the access transistor of each of the two or more further memory cells of the arrangement is coupled to the further bitline,
the further bitline is coupled to a first region of the further transistor,
the first region of the access transistor of each of the two or more further memory cells of the arrangement and the first region of the further transistor is either a source region or a drain region, and
a gate electrode of the further transistor is coupled to the local interconnect structure.

4. The IC device according to claim 3, wherein:
the interconnect structure is a first interconnect structure,
the IC device further includes a second interconnect structure,
a second region of the further transistor is coupled to the second interconnect structure, and
the second region of the further transistor is another one of the source region or the drain region than the first region of the transistor.

5. The IC device according to claim 3, wherein at least one of the transistor and the further transistor is a thin film transistor (TFT).

6. The IC device according to claim 1, wherein the interconnect structure is substantially perpendicular to a support structure over which the arrangement is provided.

7. The IC device according to claim 1, wherein:
the arrangement is a first arrangement, the transistor is a first transistor, and the bitline is a first bitline,
the IC device further includes a second arrangement that includes two or more memory cells, a second transistor, and a second bitline,
each of the two or more memory cells of the second arrangement is coupled to the second bitline, and
the second transistor is coupled to the interconnect structure.

8. The IC device according to claim 7, wherein:
an individual memory cell of the second arrangement includes an access transistor, and
each of the two or more memory cells of the second arrangement is coupled to the second bitline by having a first region of the access transistor of each of the two or more memory cells of the second arrangement being coupled to the second bitline, wherein the first region of the access transistor of each of the two or more memory cells of the second arrangement is either a source region or a drain region.

9. The IC device according to claim 8, wherein the second bitline is coupled to a first region of the second transistor, wherein the first region of the second transistor is either a source region or a drain region.

10. The IC device according to claim 9, wherein a second region of the second transistor is coupled to the interconnect structure, wherein the second region of the second transistor is another one of the source region or the drain region of the second transistor than the first region of the second transistor.

11. The IC device according to claim 10, wherein:
the first arrangement further includes a first local interconnect structure, and
a gate electrode of the first transistor is coupled to the first local interconnect structure.

12. The IC device according to claim 11, wherein:
the first arrangement further includes two or more further memory cells, a further first transistor, and a further first bitline,
each memory cell of the two or more further memory cells of the first arrangement includes an access transistor,
a first region of the access transistor of each of the two or more further memory cells of the first arrangement is coupled to the further first bitline,
the first region of the access transistor of each of the two or more further memory cells of the first arrangement is either a source region or a drain region of the access transistor of each of the two or more further memory cells of the first arrangement, the further first bitline is coupled to a first region of the further first transistor, the first region of the further first transistor is either a source region or a drain region of the access transistor of the further first transistor, and a gate electrode of the further first transistor is coupled to the first local interconnect structure.

13. The IC device according to claim 12, wherein:

the interconnect structure is a first interconnect structure, the IC device further includes a second interconnect structure, a second region of the further first transistor is coupled to the second interconnect structure, and the second region of the further first transistor is another one of the source region or the drain region of the access transistor of the further first transistor than the first region of the further first transistor.

14. The IC device according to claim 13, wherein:

the second arrangement further includes two or more further memory cells, a further second transistor, and a further second bitline, each memory cell of the two or more further memory cells of the second arrangement includes an access transistor, a first region of the access transistor of each of the two or more further memory cells of the second arrangement is coupled to the further second bitline, and the further second bitline is coupled to a first region of the further second transistor, a second region of the further second transistor is coupled to the second interconnect structure, the first region of the access transistor of each of the two or more further memory cells of the second arrangement is either a source region or a drain region of the access transistor of each of the two or more further memory cells of the second arrangement, the first region of the further second transistor is either a source region or a drain region of the further second transistor, and the second region of the further second transistor is another one of the source region or the drain region of the further second transistor.

15. The IC device according to claim 13, wherein at least one of the first interconnect structure and the second interconnect structure is substantially perpendicular to a support structure over which the first and the second arrangements are provided.

16. The IC device according to claim 1, wherein the two or more memory cells include a first memory cell and a second memory cell, the second region of the access transistor of the first memory cell is electrically connected to a capacitor of the first memory cell, and the second region of the access transistor of the second memory cell is electrically connected to a capacitor of the second memory cell.

17. An integrated circuit (IC) device, comprising:

a first arrangement that includes two or more memory cells comprising respective first access transistors, a first transistor, and a first bitline;

a second arrangement that includes two or more memory cells comprising respective second access transistors, a second transistor, and a second bitline; and an interconnect structure, wherein:

either source regions or drain regions of the first access transistors are electrically connected to one another and to the first bitline, and the first bitline is electrically connected to the first transistor, either source regions or drain regions of the second access transistors are electrically connected to one another and to the second bitline, and the second bitline is electrically connected to the second transistor, and each of the first transistor and the second transistor is electrically connected to the interconnect structure.

18. The IC device according to claim 17, wherein at least one of the first transistor and the second transistor is a thin film transistor.

19. The IC device according to claim 17, wherein:

the IC device is an IC package, the IC package includes a die and a component coupled to the IC die, and the IC die includes the first arrangement, the second arrangement, and the interconnect structure.

20. The IC device according to claim 19, wherein the component is one of a package substrate, an interposer, or a further IC die.

* * * * *